United States Patent
Kusunoki et al.

(10) Patent No.: US 11,644,869 B2
(45) Date of Patent: May 9, 2023

(54) TOUCH PANEL COMPRISING CONDUCTIVE LAYERS HAVING OPENING OVERLAPPING WITH LIGHT-EMITTING ELEMENT

(71) Applicant: SEMICONDUCTOR ENERGY LABORATORY CO., LTD., Atsugi (JP)

(72) Inventors: Koji Kusunoki, Kanagawa (JP); Hiroyuki Miyake, Kanagawa (JP); Kazunori Watanabe, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/884,154

(22) Filed: May 27, 2020

(65) Prior Publication Data

US 2020/0285334 A1    Sep. 10, 2020

Related U.S. Application Data

(63) Continuation of application No. 14/725,205, filed on May 29, 2015, now abandoned.

(30) Foreign Application Priority Data

| May 30, 2014 | (JP) | 2014-112316 |
| Jun. 23, 2014 | (JP) | 2014-128409 |
| Dec. 1, 2014 | (JP) | 2014-242912 |

(51) Int. Cl.
*G06F 1/16* (2006.01)
*G06F 3/044* (2006.01)
(Continued)

(52) U.S. Cl.
CPC ............ *G06F 1/1652* (2013.01); *G06F 3/045* (2013.01); *G06F 3/0412* (2013.01);
(Continued)

(58) Field of Classification Search
CPC ...... G06F 3/041; G06F 3/0412; G06F 3/0416; G06F 3/04164; G06F 3/044;
(Continued)

(56) References Cited

U.S. PATENT DOCUMENTS

| 6,445,432 B2 | 9/2002 | Yamamoto et al. |
| 6,509,616 B2 | 1/2003 | Yamazaki |

(Continued)

FOREIGN PATENT DOCUMENTS

| CN | 102150095 A | 8/2011 |
| CN | 102819368 A | 12/2012 |

(Continued)

OTHER PUBLICATIONS

Taiwanese Office Action (Application No. 110115199) dated Sep. 27, 2021.
(Continued)

*Primary Examiner* — Nathan Danielsen
(74) *Attorney, Agent, or Firm* — Fish & Richardson P.C.

(57) ABSTRACT

To increase the detection sensitivity of a touch panel, provide a thin touch panel, provide a foldable touch panel, or provide a lightweight touch panel. A display element and a capacitor forming a touch sensor are provided between a pair of substrates. Preferably, a pair of conductive layers forming the capacitor each have an opening. The opening and the display element are provided to overlap each other. A light-blocking layer is provided between a substrate on the display surface side and the pair of conductive layers forming the capacitor.

12 Claims, 22 Drawing Sheets

(51) Int. Cl.
  *H01L 27/32* (2006.01)
  *G06F 3/0488* (2022.01)
  *H01L 51/00* (2006.01)
  *G06F 3/041* (2006.01)
  *G06F 3/045* (2006.01)
  *G06F 15/02* (2006.01)

(52) U.S. Cl.
  CPC .......... *G06F 3/0445* (2019.05); *G06F 3/0446* (2019.05); *G06F 3/0488* (2013.01); *G06F 3/04166* (2019.05); *G06F 15/0216* (2013.01); *H01L 27/323* (2013.01); *H01L 51/0097* (2013.01); *G06F 1/1618* (2013.01); *G06F 1/1677* (2013.01); *G06F 2200/1633* (2013.01); *G06F 2203/04101* (2013.01); *G06F 2203/04102* (2013.01); *G06F 2203/04104* (2013.01); *G06F 2203/04111* (2013.01); *G06F 2203/04112* (2013.01); *G06F 2203/04808* (2013.01); *Y02E 10/549* (2013.01)

(58) Field of Classification Search
  CPC .... G06F 3/0443; G06F 3/0445; G06F 3/0446; G06F 3/0448; G06F 3/045; G06F 3/047; G06F 3/048–04886; G06F 1/1613–1618; G06F 1/1637; G06F 1/1652; G06F 1/1675; G06F 1/1677; G06F 15/0216; G06F 2200/1633; G06F 2203/04101–04104; G06F 2203/04111; G06F 2203/04112; G06F 2203/04808; G09G 3/30–3291; G09G 3/36–3696; G02F 1/13338; G02F 1/133512; G02F 1/133514; H01L 27/323; H01L 27/3272; H01L 27/3276
  See application file for complete search history.

(56) References Cited

U.S. PATENT DOCUMENTS

| | | | |
|---|---|---|---|
| 6,720,198 B2 | 4/2004 | Yamagata et al. |
| 6,765,231 B2 | 7/2004 | Yamazaki |
| 6,781,162 B2 | 8/2004 | Yamazaki et al. |
| 6,798,132 B2 | 9/2004 | Satake |
| 6,909,240 B2 | 6/2005 | Osame et al. |
| 6,992,439 B2 | 1/2006 | Yamazaki et al. |
| 7,115,434 B2 | 10/2006 | Yamazaki et al. |
| 7,199,516 B2 | 4/2007 | Seo et al. |
| 7,264,979 B2 | 9/2007 | Yamagata et al. |
| 7,274,044 B2 | 9/2007 | Kawakami et al. |
| 7,279,194 B2 | 10/2007 | Hiroki et al. |
| 7,301,279 B2 | 11/2007 | Sakakura et al. |
| 7,306,978 B2 | 12/2007 | Yamazaki et al. |
| 7,309,269 B2 | 12/2007 | Yamazaki et al. |
| 7,314,785 B2 | 1/2008 | Yamazaki et al. |
| 7,319,238 B2 | 1/2008 | Yamazaki |
| 7,342,256 B2 | 3/2008 | Yamazaki |
| 7,402,945 B2 | 7/2008 | Yamazaki et al. |
| 7,402,948 B2 | 7/2008 | Yamazaki et al. |
| 7,473,928 B1 | 1/2009 | Yamazaki et al. |
| 7,495,257 B2 | 2/2009 | Kawakami et al. |
| 7,520,790 B2 | 4/2009 | Yamazaki et al. |
| 7,570,233 B2 | 8/2009 | Iwabuchi et al. |
| 7,579,771 B2 | 8/2009 | Yamazaki et al. |
| 7,663,305 B2 | 2/2010 | Yamazaki et al. |
| 7,683,532 B2 | 3/2010 | Abe et al. |
| 7,755,278 B2 | 7/2010 | Nomura et al. |
| 7,786,496 B2 | 8/2010 | Yamazaki et al. |
| 7,825,021 B2 | 11/2010 | Yamazaki et al. |
| 7,838,347 B2 | 11/2010 | Suzawa et al. |
| 8,138,555 B2 | 3/2012 | Yamazaki |
| 8,199,127 B2 | 6/2012 | Mamba et al. |
| 8,367,440 B2 | 2/2013 | Takayama et al. |
| 8,372,668 B2 | 2/2013 | Hatano et al. |
| 8,400,418 B2 | 3/2013 | Matsuo |
| 8,441,185 B2 | 5/2013 | Kuwabara et al. |
| 8,551,796 B2 | 10/2013 | Yamazaki |
| 8,587,529 B2 * | 11/2013 | Yang ..................... G06F 3/0443 345/173 |
| 8,597,965 B2 | 12/2013 | Hatano et al. |
| 8,742,405 B2 | 6/2014 | Ikeda et al. |
| 8,743,300 B2 | 6/2014 | Chang et al. |
| 8,772,783 B2 | 7/2014 | Hirosue et al. |
| 8,803,816 B2 | 8/2014 | Kilpatrick, II et al. |
| 8,804,056 B2 | 8/2014 | Chang et al. |
| 8,836,611 B2 | 9/2014 | Kilpatrick, II et al. |
| 8,860,632 B2 | 10/2014 | Kilpatrick, II et al. |
| 8,860,765 B2 | 10/2014 | Kilpatrick, II et al. |
| 8,863,038 B2 | 10/2014 | King et al. |
| 8,866,840 B2 | 10/2014 | Dahl et al. |
| 8,928,011 B2 | 1/2015 | Tanada et al. |
| 8,933,874 B2 | 1/2015 | Lundqvist et al. |
| 8,947,320 B2 | 2/2015 | King et al. |
| 8,981,638 B2 | 3/2015 | Isa |
| 9,001,073 B2 | 4/2015 | Sato et al. |
| 9,009,984 B2 | 4/2015 | Caskey et al. |
| 9,025,090 B2 | 5/2015 | Chang et al. |
| 9,041,026 B2 | 5/2015 | Yamazaki |
| 9,081,223 B2 | 7/2015 | Wang et al. |
| 9,082,678 B2 | 7/2015 | Yamazaki et al. |
| 9,087,964 B2 | 7/2015 | Hatano et al. |
| 9,146,414 B2 | 9/2015 | Chang et al. |
| 9,159,948 B2 | 10/2015 | Sugisawa et al. |
| 9,209,355 B2 | 12/2015 | Senda et al. |
| 9,246,133 B2 | 1/2016 | Yamazaki et al. |
| 9,356,255 B2 | 5/2016 | Hatano |
| 9,406,725 B2 | 8/2016 | Yamazaki et al. |
| 9,436,334 B2 | 9/2016 | Kida et al. |
| 9,727,193 B2 | 8/2017 | Chang et al. |
| 10,032,833 B2 | 7/2018 | Yamazaki et al. |
| 10,120,410 B2 | 11/2018 | Yamazaki et al. |
| 10,516,007 B2 | 12/2019 | Yamazaki et al. |
| 10,818,737 B2 | 10/2020 | Yamazaki et al. |
| 11,088,222 B2 | 8/2021 | Yamazaki et al. |
| 2006/0109216 A1 | 5/2006 | Iwabuchi et al. |
| 2007/0287209 A1 | 12/2007 | Fujii |
| 2009/0213090 A1 * | 8/2009 | Mamba ................. G06F 3/0445 345/174 |
| 2012/0080664 A1 | 4/2012 | Kim et al. |
| 2012/0169683 A1 | 7/2012 | Hong |
| 2012/0264489 A1 | 10/2012 | Choi et al. |
| 2013/0082944 A1 | 4/2013 | Juan et al. |
| 2013/0095885 A1 * | 4/2013 | Liu ......................... H04M 1/22 455/556.1 |
| 2013/0147730 A1 | 6/2013 | Chien et al. |
| 2013/0187704 A1 | 7/2013 | Edwards |
| 2013/0278513 A1 * | 10/2013 | Jang ...................... G06F 3/0446 345/173 |
| 2013/0321366 A1 | 12/2013 | Kozuma et al. |
| 2013/0341651 A1 | 12/2013 | Kim et al. |
| 2014/0063719 A1 | 3/2014 | Yamazaki et al. |
| 2014/0103385 A1 | 4/2014 | Hatano et al. |
| 2014/0104510 A1 | 4/2014 | Wang et al. |
| 2014/0175469 A1 | 6/2014 | Dozen et al. |
| 2014/0198268 A1 * | 7/2014 | Sugita .................. G06F 3/0412 349/12 |
| 2014/0306260 A1 | 10/2014 | Yamazaki et al. |
| 2014/0313434 A1 | 10/2014 | Kim et al. |
| 2015/0049030 A1 | 2/2015 | Her |
| 2015/0049260 A1 | 2/2015 | Yashiro et al. |
| 2015/0060125 A1 | 3/2015 | Stevenson et al. |
| 2015/0062525 A1 | 3/2015 | Hirakata |
| 2015/0318339 A1 | 11/2015 | Nakamura et al. |
| 2016/0055937 A1 | 2/2016 | Hakii et al. |
| 2017/0269738 A1 | 9/2017 | Chang et al. |
| 2018/0348811 A1 | 12/2018 | Yamazaki et al. |
| 2019/0113948 A1 | 4/2019 | Yamazaki et al. |
| 2019/0138135 A1 | 5/2019 | Chang et al. |

(56) References Cited

U.S. PATENT DOCUMENTS

2019/0155332 A1   5/2019  Yamazaki et al.
2021/0151515 A1   5/2021  Yamazaki et al.

FOREIGN PATENT DOCUMENTS

| | | |
|---|---|---|
| CN | 102955635 A | 3/2013 |
| CN | 203502946 U | 3/2014 |
| EP | 2096526 A | 9/2009 |
| EP | 2469380 A | 6/2012 |
| EP | 2720124 A | 4/2014 |
| EP | 2874049 A | 5/2015 |
| EP | 3190476 A | 7/2017 |
| JP | 2002-198537 A | 7/2002 |
| JP | 2003-174153 A | 6/2003 |
| JP | 2006-178428 A | 7/2006 |
| JP | 2009-205321 A | 9/2009 |
| JP | 2010-002958 A | 1/2010 |
| JP | 2012-083959 A | 4/2012 |
| JP | 2012-181822 A | 9/2012 |
| JP | 2014-063159 A | 4/2014 |
| JP | 2014-089641 A | 5/2014 |
| TW | 200630931 | 9/2006 |
| TW | 201229855 | 7/2012 |
| TW | 201346675 | 11/2013 |
| TW | 201407225 | 2/2014 |
| TW | 201415623 | 4/2014 |
| WO | WO-2010/028394 | 3/2010 |
| WO | WO-2010/028397 | 3/2010 |
| WO | WO-2010/028399 | 3/2010 |
| WO | WO-2010/028402 | 3/2010 |
| WO | WO-2010/028403 | 3/2010 |
| WO | WO-2010/028404 | 3/2010 |
| WO | WO-2010/028405 | 3/2010 |
| WO | WO-2010/028406 | 3/2010 |
| WO | WO-2010/028407 | 3/2010 |
| WO | WO-2012/087639 | 6/2012 |
| WO | WO-2013/141056 | 9/2013 |
| WO | WO-2013/145958 | 10/2013 |
| WO | WO-2014/010433 | 1/2014 |
| WO | WO-2014/034749 | 3/2014 |

OTHER PUBLICATIONS

Taiwanese Office Action (Application No. 111116711) dated Jun. 27, 2022.

Chinese Office Action (Application No. 202010241196.9) dated Mar. 15, 2023.

* cited by examiner

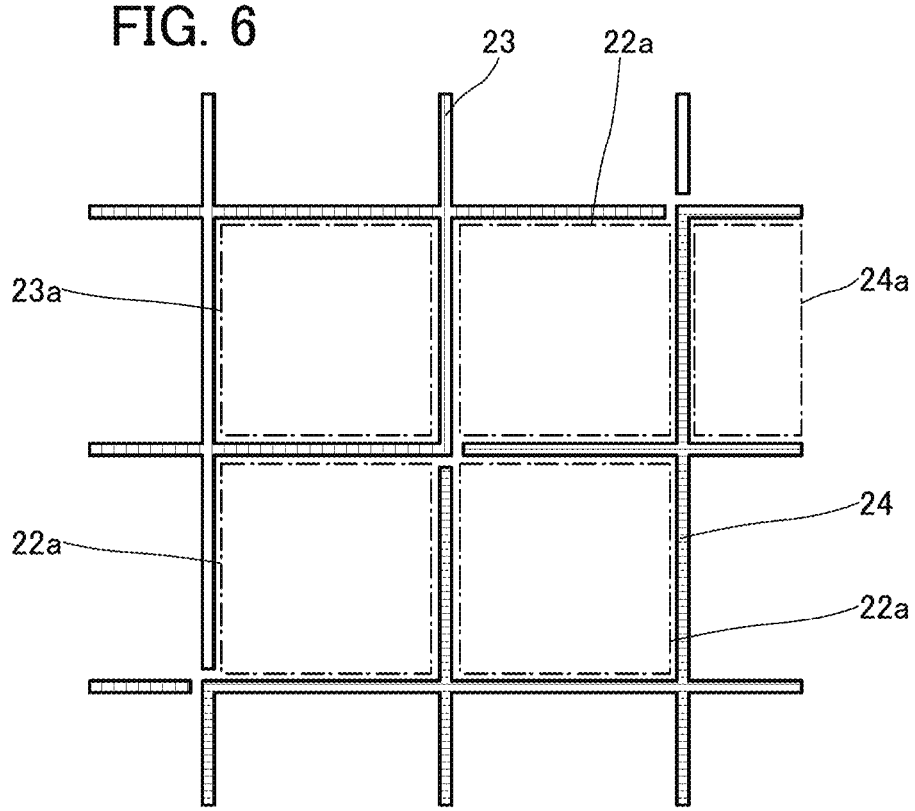

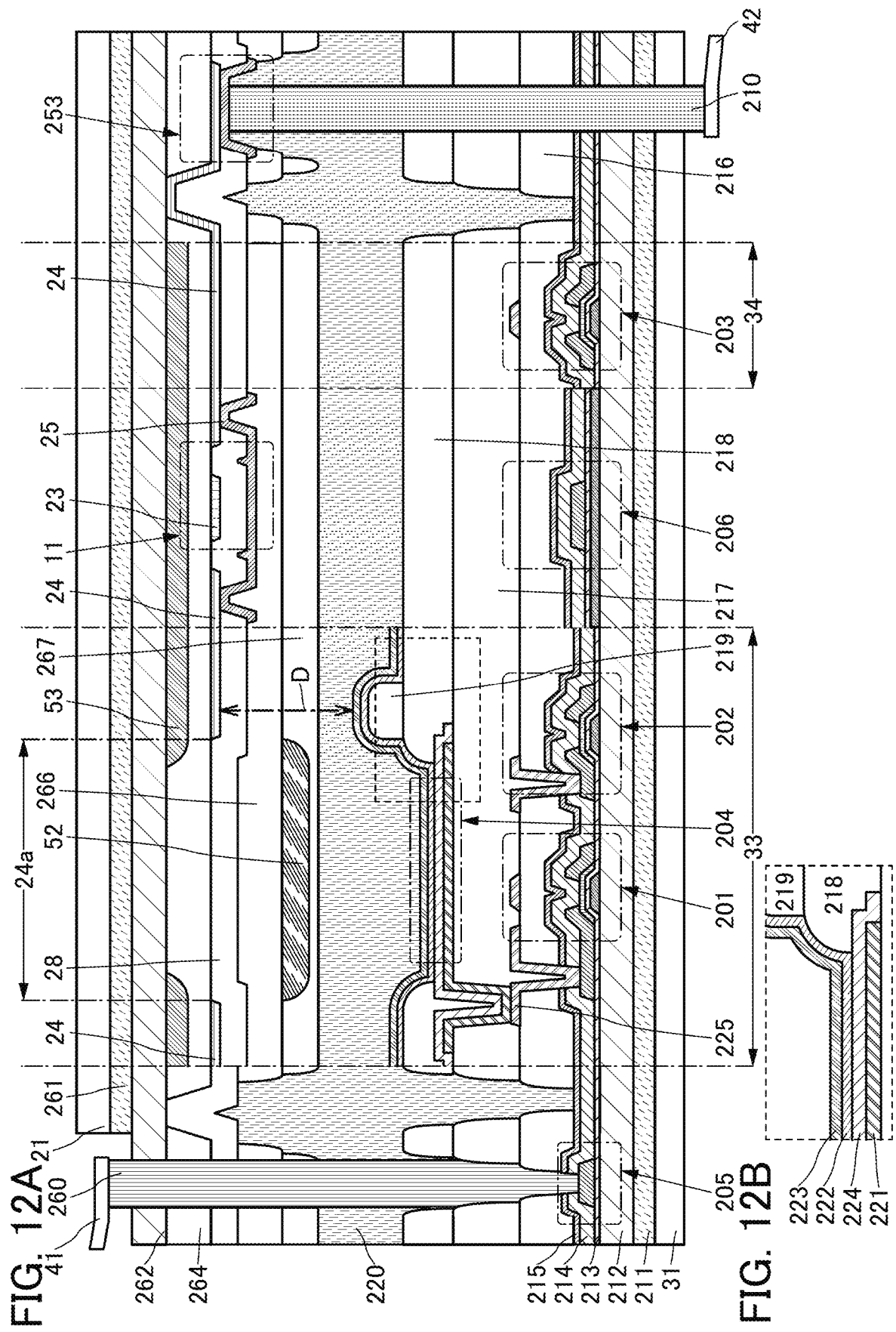

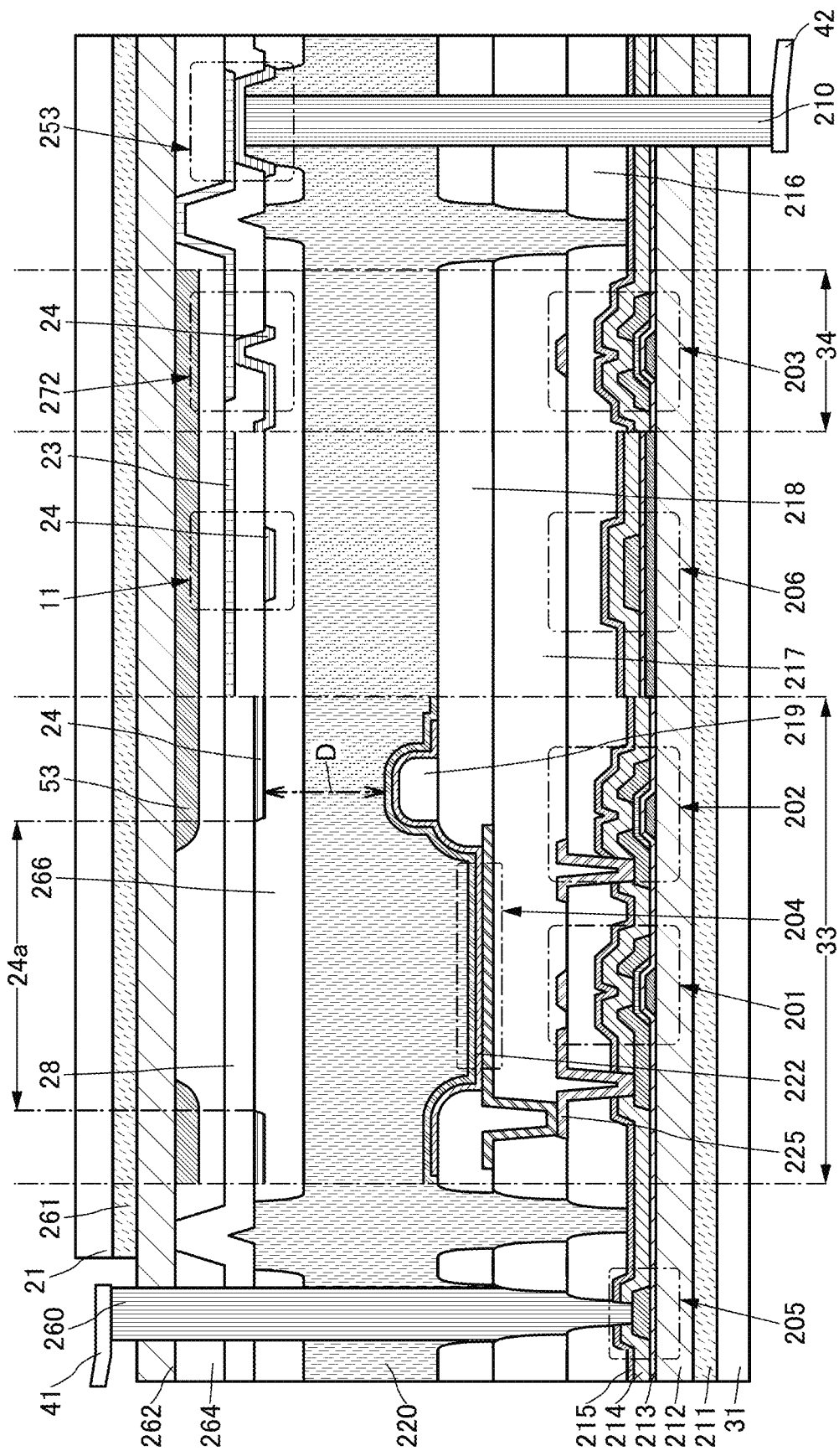

ND OVERLAPPING WITH LIGHT-EMITTING
TOUCH PANEL COMPRISING CONDUCTIVE LAYERS HAVING OPENING OVERLAPPING WITH LIGHT-EMITTING ELEMENT

CROSS-REFERENCE TO RELATED APPLICATIONS

This application is a continuation of U.S. application Ser. No. 14/725,205, filed May 29, 2015, now pending, which claims the benefit of foreign priority applications filed in Japan as Serial No. 2014-112316 on May 30, 2014, Serial No. 2014-128409 on Jun. 23, 2014, and Serial No. 2014-242912 on Dec. 1, 2014, all of which are incorporated by reference.

BACKGROUND OF THE INVENTION

1. Field of the Invention

One embodiment of the present invention relates to a touch panel.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, an electronic appliance, a lighting device, an input device, an input/output device, a method for driving any of them, and a method for manufacturing any of them.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic appliance may each include a semiconductor device.

2. Description of the Related Art

Recent display devices are expected to be applied to a variety of uses and become diversified. For example, a smartphone and a tablet with a touch panel are being developed as portable information terminals.

Patent Document 1 discloses a flexible active matrix light-emitting device in which an organic EL element and a transistor serving as a switching element are provided over a film substrate.

REFERENCE

Patent Document

[Patent Document 1] Japanese Published Patent Application No. 2003-174153

SUMMARY OF THE INVENTION

What is desirable is a touch panel in which a display panel is provided with a function of inputting data with a finger, a stylus, or the like touching a screen as a user interface.

Furthermore, it is demanded that an electronic appliance using a touch panel is reduced in thickness and weight. Therefore, a touch panel itself is required to be reduced in thickness and weight.

For example, in a touch panel, a touch sensor can be provided on the viewer side (the display surface side) of a display panel.

In a touch panel where a capacitive touch sensor is provided so as to overlap with the display surface side of a display panel, when the distance between a pixel or a wiring of the display panel and an electrode or a wiring of the touch sensor is reduced, the touch sensor is likely to be influenced by noise caused when the display panel is driven, which results in a reduction of the detection sensitivity of the touch panel in some cases.

One object of one embodiment of the present invention is to improve detection sensitivity of a touch panel. Another object is to provide a thin touch panel. Another object is to provide a foldable touch panel. Another object is to provide a lightweight touch panel. Another object is to provide a touch panel with high reliability.

Another object is to provide a novel input device. Another object is to provide a novel input/output device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a touch panel including a first substrate, a second substrate, a first conductive layer, a second conductive layer, a first light-emitting element, a second light-emitting element, and a light-blocking layer. The first conductive layer has a first opening, and the second conductive layer has a second opening. The first conductive layer and the second conductive layer form a capacitor. The first opening and the first light-emitting element overlap with each other in a region. The second opening and the second light-emitting element overlap with each other in a region. The first conductive layer and the light-blocking layer overlap with each other in a region. The second conductive layer and the light-blocking layer overlap with each other in a region. The first light-emitting element and the second light-emitting element are positioned between the first substrate and the second substrate in a region. The first conductive layer and the second conductive layer are positioned between the first light-emitting element or the second light-emitting element and the second substrate in a region. The light-blocking layer is positioned between the first conductive layer or the second conductive layer and the second substrate in a region.

In the above embodiment, a CR value of the first conductive layer or the second conductive layer is preferably greater than 0 s and less than or equal to $1\times10^{-4}$ s.

In the above embodiment, an aperture ratio of the first conductive layer or the second conductive layer is preferably greater than or equal to 20% and less than 100% in a region.

In the above embodiment, it is preferable that the touch panel include a third conductive layer, the third conductive layer be provided closer to the first substrate than the first conductive layer or the second conductive layer, and a distance between the first conductive layer and the third conductive layer or a distance between the second conductive layer and the third conductive layer be greater than or equal to 25 nm and less than or equal to 50 µm in a region.

In the above embodiment, it is preferable that the touch panel include a third light-emitting element, the third light-emitting element is positioned between the first substrate and the second substrate in a region, and the third light-emitting element and the first opening overlap with each other in a region.

In the above embodiment, it is preferable that the touch panel include a fourth light-emitting element, the fourth light-emitting element is positioned between the first substrate and the second substrate in a region, and the fourth light-emitting element and the second opening overlap with each other in a region.

In the above embodiment, it is preferable that the touch panel include an insulating layer, the first conductive layer and the second conductive layer overlap with each other in a region, and the insulating layer is positioned between the first conductive layer and the second conductive layer in a region.

In the above embodiment, it is preferable that the touch panel include a fourth conductive layer, a fifth conductive layer, and an insulating layer. Here, the fourth conductive layer and the light-blocking layer overlap with each other in a region, the fifth conductive layer and the light-blocking layer overlap with each other in a region, the fifth conductive layer and the second conductive layer overlap with each other in a region, the insulating layer is positioned between the first conductive layer and the fifth conductive layer in a region, the insulating layer is positioned between the second conductive layer and the fifth conductive layer in a region, and the insulating layer is positioned between the fourth conductive layer and the fifth conductive layer in a region. The insulating layer has a third opening and a fourth opening. The first conductive layer and the fifth conductive layer are electrically connected to each other through the third opening. It is preferable that the fourth conductive layer and the fifth conductive layer be electrically connected to each other through the fourth opening.

It is preferable that the touch panel further include a fifth light-emitting element. At this time, it is preferable that the fourth conductive layer have a fifth opening, the fifth light-emitting element is positioned between the first substrate and the second substrate in a region, and the fifth opening and the fifth light-emitting element overlap with each other in a region.

One embodiment of the present invention can improve the detection sensitivity of a touch panel. Alternatively, a thin touch panel can be provided. Alternatively, a foldable touch panel can be provided. Alternatively, a lightweight touch panel can be provided. Alternatively, a touch panel with high reliability can be provided.

Alternatively, a novel input device can be provided. Alternatively, a novel input/output device can be provided. Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIG. 6 shows a structure example of a touch sensor of an embodiment.

FIGS. 12A and 12B show a structure example of a touch panel of an embodiment.

FIG. 15 shows a structure example of a touch panel of an embodiment.

DETAILED DESCRIPTION OF THE INVENTION

Figure 1A:
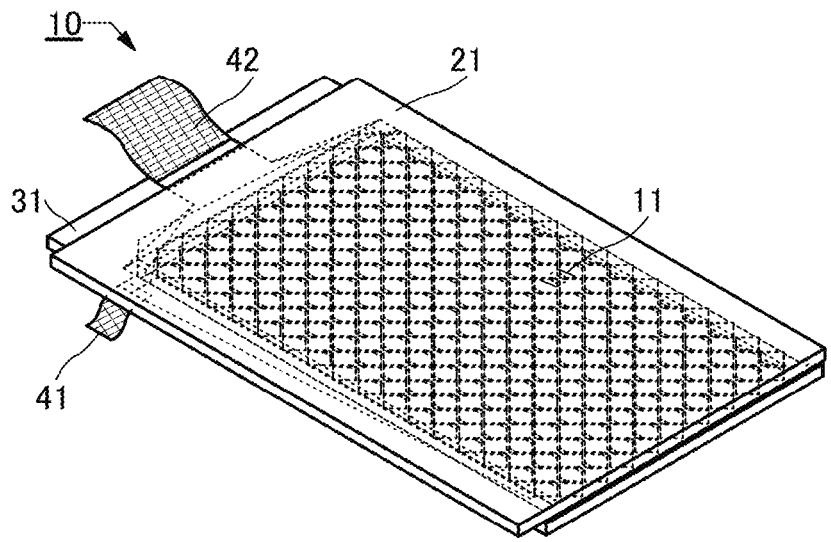
FIGS. 1A and 1B show a structure example of a touch panel module of an embodiment.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and description of such portions is not repeated. Further, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, ordinal numbers such as "first", "second", and the like are used in order to avoid confusion among components and do not limit the number.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Embodiment 1

In this embodiment, a structure example of a touch panel of one embodiment of the present invention will be described with reference to drawings. In the description below, a capacitive touch sensor is used as a touch sensor of a touch panel.

Note that in this specification and the like, a touch panel has a function of displaying or outputting an image or the like on or to a display surface and a function of a touch sensor capable of sensing contact or proximity of an object such as a finger or a stylus on or to the display surface. Therefore, the touch panel is an embodiment of an input/output device.

In this specification and the like, a structure in which a connector such as a flexible printed circuit (FPC) or a tape carrier package (TCP) is attached to a substrate of a touch panel, or a structure in which an integrated circuit (IC) is directly mounted on a substrate by a chip on glass (COG) method is referred to as a touch panel module or simply referred to as a touch panel in some cases.

A capacitive touch sensor that can be used for one embodiment of the present invention includes a capacitor. The capacitor can have a structure in which a dielectric is provided between a first conductive layer and a second conductive layer. At this time, part of the first conductive layer and part of the second conductive layer each function as an electrode of the capacitor. The other part of the first conductive layer and the other part of the second conductive layer may each function as a wiring.

Examples of the capacitive touch sensor are a surface capacitive touch sensor and a projected capacitive touch sensor. Examples of the projected capacitive touch sensor are a self-capacitive touch sensor, a mutual capacitive touch sensor, and the like, which differ mainly in the driving method. The use of a mutual capacitive type is preferable because multiple points can be sensed simultaneously.

A touch panel of one embodiment of the present invention includes, between a pair of substrates, a display element and a capacitor included in a touch sensor. Thus, a thin and lightweight touch panel can be obtained.

It is preferable that a pair of conductive layers included in the capacitor each have an opening. It is preferable that the opening and the display element overlap with each other. Such a structure enables extraction of light emitted from the display element to the outside through the opening, and therefore, the pair of conductive layers included in the capacitor do not necessarily have a light-transmitting property. That is, a material such as metal or alloy that has lower resistance than a light-transmitting conductive material can be used as a material for the pair of conductive layers included in the capacitor. This reduces the influence of detection signal delay or the like and increases the detection sensitivity of the touch panel. Furthermore, such a structure can be applied to large-sized display devices such as televisions as well as portable devices.

Since the pair of conductive layers can be formed of a low-resistance material, each of the conductive layers can have an extremely small line width. That is, a surface area of each of the conductive layers when seen from the display surface side (in a plan view) can be reduced. As a result, the influence of noise caused by driving a pixel is suppressed, which increases detection sensitivity. Furthermore, even when the capacitor included in the touch sensor and the display element included in the pixel are provided close to each other and between the two substrates, a reduction in detection sensitivity can be suppressed. Thus, the thickness of the touch panel can be reduced. In particular, in the case where a flexible material is used for the pair of substrates, a flexible touch panel that is thin and lightweight can be obtained.

In the case of using a projected capacitive type, the product of resistance and capacitance (also referred to as a CR value or a time constant) of the first conductive layer is preferably as small as possible. Similarly, the CR value of the second conductive layer is preferably as small as possible.

For example, in the case of using a projected mutual capacitive type, a pulse voltage is supplied to one of the conductive layers, and a current flowing in the other conductive layer is sensed. At this time, as the CR value of the conductive layer where current sensing is performed is smaller, a change in current due to the presence or absence of a touch motion can be increased more. Furthermore, as the CR value of the conductive layer supplied with the pulse voltage is smaller, delay in the waveform of the pulse voltage is suppressed more and detection sensitivity can be increased more.

In the case of using a projected self-capacitive type, a pulse voltage is applied to each of the pair of conductive layers, and a current flowing in each of the conductive layers is sensed. Therefore, as the CR value of each of the conductive layers is smaller, detection sensitivity can be increased more.

For example, the CR value of the first conductive layer or the second conductive layer is greater than 0 s and less than or equal to $1\times10^{-4}$ s, preferably greater than 0 s and less than or equal to $5\times10^{-5}$ s, more preferably greater than 0 s and less than or equal to $5\times10^{-6}$ s, still more preferably greater than 0 s and less than or equal to $5\times10^{-7}$ s, still more preferably greater than 0 s and less than or equal to $2\times10^{-7}$ s. In particular, when the CR value is $1\times10^{-6}$ s or less, high detection sensitivity can be achieved while the influence of noise is suppressed.

The first conductive layer or the second conductive layer preferably has a mesh shape having a plurality of openings. At this time, the aperture ratio of the first conductive layer or the second conductive layer (the proportion of the opening area of the first conductive layer or the second conductive layer per unit area) is preferably higher than at least the aperture ratio of the pixel included in the touch panel. When the aperture ratio of the first conductive layer or the second conductive layer is higher than the aperture ratio of the pixel, blocking of light emitted from the pixel by the first conductive layer or the second conductive layer can be suppressed. When the aperture ratio is increased by increasing the size of the opening, the area where the object overlaps with the first conductive layer or the second conductive layer is reduced, and therefore, detection sensitivity is reduced in some cases. In view of this, the aperture ratio and an opening pattern are preferably set so that the opening area is smaller than the area of the object.

For example, the aperture ratio of the first conductive layer or the second conductive layer is preferably higher than or equal to 20% and lower than 100%, more preferably higher than or equal to 30% and lower than 100%, still more preferably higher than or equal to 50% and lower than 100%.

The touch panel of one embodiment of the present invention has high detection sensitivity and is less influenced by noise caused when a display panel is driven. Therefore, the thickness of the touch panel itself can be reduced. For example, the distance between the pair of substrates included in the touch panel can be reduced to 50 nm or more and 100 µm or less, preferably 200 nm or more and 50 µm or less, more preferably 500 nm or more and 20 µm or less. When a flexible substrate is used for the pair of substrates at this time, a flexible touch panel strong against bending can be obtained.

In particular, the distance between the first conductive layer or the second conductive layer and a conductive layer closer to the substrate provided with the display element than the first conductive layer or the second conductive layer is set to, for example, greater than or equal to 25 nm and less than or equal to 50 µm, preferably greater than or equal to 50 nm and less than or equal to 10 µm, more preferably greater than or equal to 50 nm and less than or equal to 5 µm.

Furthermore, a light-blocking layer is preferably provided between the substrate on the display surface side and the pair of electrodes included in the capacitor. The light-blocking layer may have a function of suppressing color mixing between adjacent pixels. When the light-blocking layer is closer to the display surface than the pair of electrodes, reflection of external light by the pair of electrodes is prevented, and the pair of electrodes is prevented from being visually recognized from the display surface side. Thus, the touch panel can have high display quality.

The light-blocking layer and the pair of electrodes included in the capacitor are preferably provided between adjacent pixels when seen from the display surface side (in a plan view). Furthermore, the width of each of the pair of electrodes included in the capacitor is preferably smaller than the width of the light-blocking layer or the interval between the two adjacent pixels.

A more specific structure example of one embodiment of the present invention is described below with reference to drawings.

Structure Example

Figure 1B:
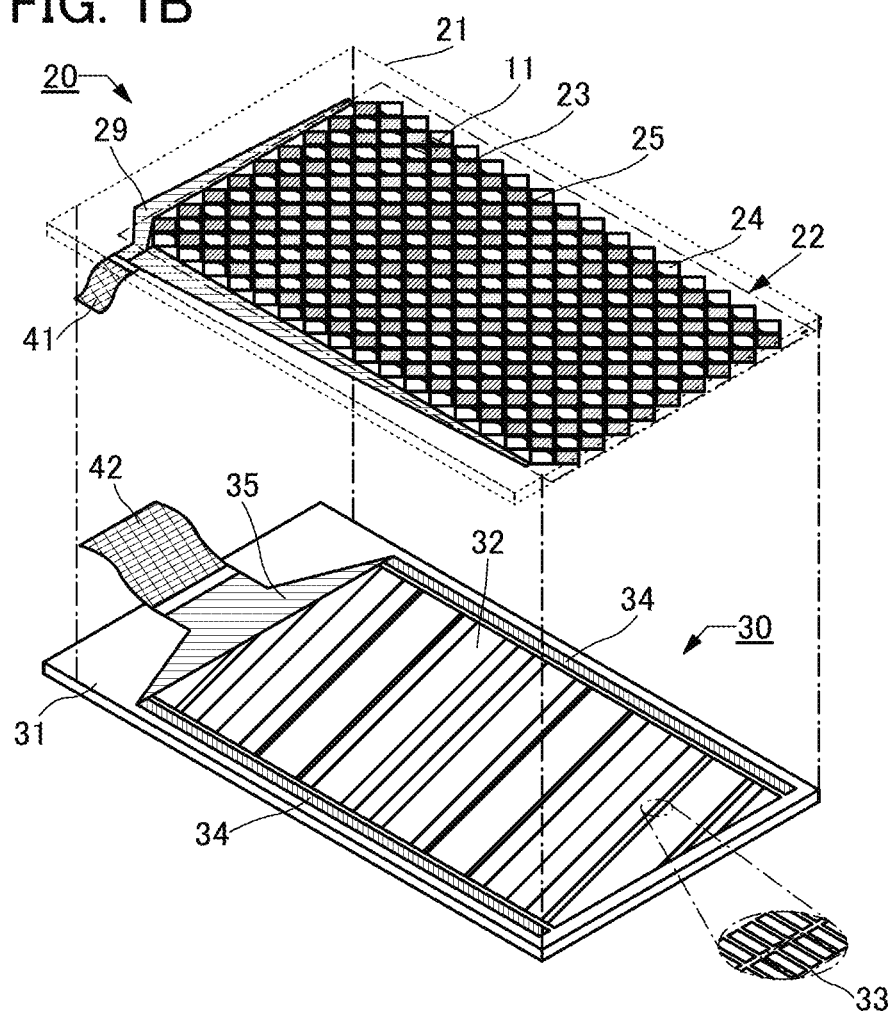

FIG. 1A is a schematic perspective view of a touch panel module 10 of one embodiment of the present invention. FIG. 1B is a developed view of the schematic perspective view of the touch panel module 10. In the touch panel module, a touch sensor module 20 and a display panel 30 are provided to overlap with each other.

In the touch sensor module 20, a substrate 21 is provided with an FPC 41. Furthermore, a touch sensor 22 is provided on a surface on the display panel 30 side of the substrate 21. The touch sensor 22 includes a conductive layer 23, a conductive layer 24, and a conductive layer 25. Furthermore, the touch sensor module 20 includes a wiring 29 which electrically connects these conductive layers to the FPC 41. The FPC 41 has a function of supplying a signal from the outside to the touch sensor 22. Furthermore, the FPC 41 has a function of outputting a signal from the touch sensor 22 to the outside. Note that the substrate without the FPC 41 is also simply referred to as a touch sensor, or referred to as a touch sensor substrate or a touch sensor panel.

The touch sensor 22 includes a plurality of conductive layers 23, a plurality of conductive layers 24, and a plurality of conductive layers 25. Each of the conductive layers 23 has a shape extending in one direction. The plurality of conductive layers 23 are arranged in a direction crossing the extending direction. Each of the conductive layers 24 is positioned between two adjacent conductive layers 23. Each of the conductive layers 25 electrically connects two conductive layers 24 adjacent in the direction crossing the extending direction of the conductive layers 23. That is, the plurality of conductive layers 24 arranged in the direction crossing the extending direction of the conductive layers 23 are electrically connected to each other with the plurality of conductive layers 25.

Here, there is a region where the conductive layer 23 and the conductive layer 25 overlap with each other. The conductive layer 23, the conductive layer 25, and an insulating layer which is provided therebetween and functions as a dielectric form a capacitor 11. Therefore, the conductive layer 23 and the conductive layer 25 partly function as the pair of electrodes of the capacitor 11.

Note that here, the plurality of conductive layers 24 are electrically connected to each other with the conductive layer 25. Alternatively, it is possible to employ a structure in which the conductive layer 24 has a shape extending in one direction like the conductive layer 23, an insulating layer is provided between the conductive layer 23 and the conductive layer 24, and the conductive layer 25 is not provided. In this case, part of the conductive layer 24 functions as one electrode of the capacitor 11.

Note that, for example, a low-resistance material is preferably used as a material of conductive films such as the conductive layer 23, the conductive layer 24, and the conductive layer 25, i.e., a wiring and an electrode in the touch panel. As an example, metal such as silver, copper, or aluminum may be used. Alternatively, a metal nanowire including a number of conductors with an extremely small width (for example, a diameter of several nanometers) may be used. Examples of such a metal nanowire include an Ag nanowire, a Cu nanowire, and an Al nanowire. In the case of using an Ag nanowire, light transmittance of 89% or more and a sheet resistance of 40 ohm/square or more and 100 ohm/square or less can be achieved. Note that because such a metal nanowire provides high transmittance, the metal nanowire may be used for an electrode of the display element, e.g., a pixel electrode or a common electrode.

In the display panel 30, a display portion 32 is provided over a substrate 31. The display portion 32 includes a plurality of pixels 33 arranged in a matrix. Each pixel 33 preferably includes a plurality of sub-pixels. Each sub-pixel includes a display element. A circuit 34 electrically connected to the pixel 33 in the display portion 32 is preferably provided over the substrate 31. For example, a circuit functioning as a gate driver circuit can be used for the circuit 34. An FPC 42 has a function of supplying a signal from the outside to at least one of the display portion 32 and the circuit 34. An IC functioning as a source driver circuit is preferably mounted on the substrate 31 or the FPC 42. The IC can be mounted on the substrate 31 by a COG method or a COF method. Alternatively, the FPC 42, a TAB, a TCP, or the like on which an IC is mounted can be attached to the substrate 31. Note that an object in which an IC or a connector such as an FPC is mounted on the display panel 30 can be referred to as a display panel module.

The touch panel module of one embodiment of the present invention can output positional information based on the change in capacitance by the touch sensor 22 at the time of a touch motion. Furthermore, the display portion 32 can display an image.

Structural Example of Touch Sensor

Figure 2A:
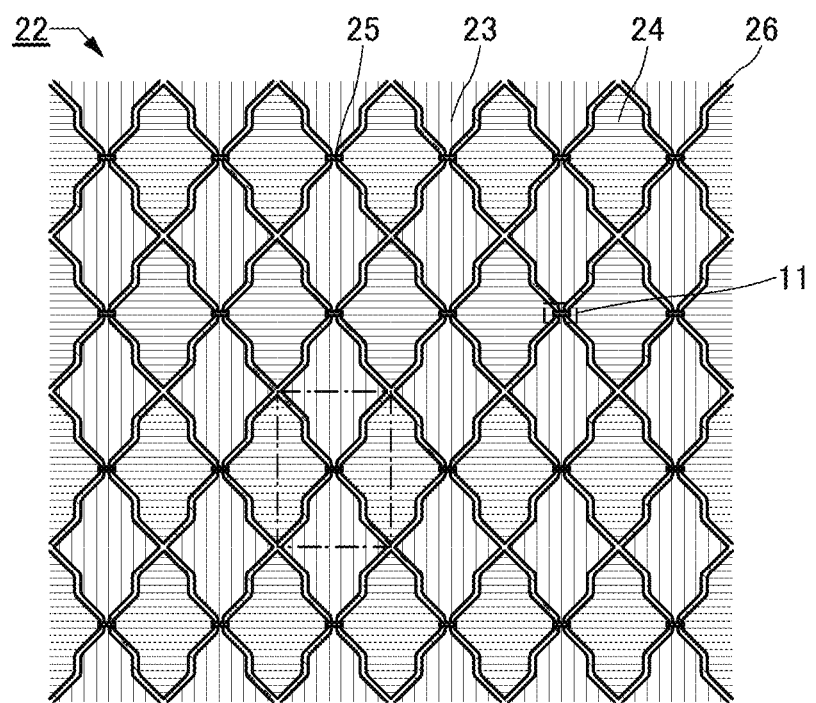
FIGS. 2A to 2C show a structure example of a touch sensor of an embodiment.
Figure 2B:
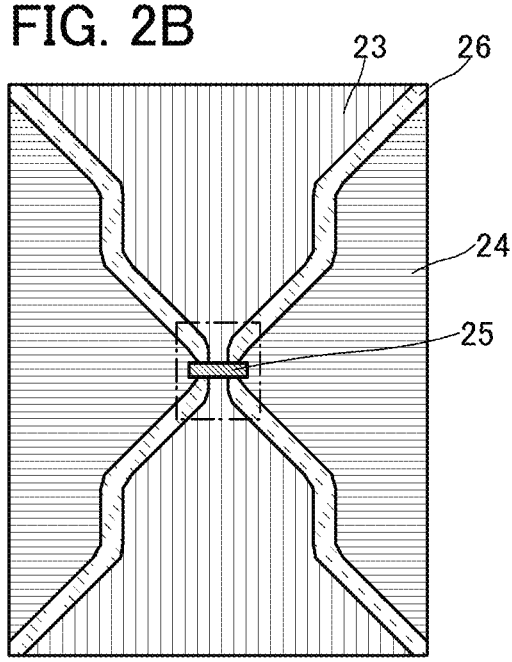

FIG. 2A is a schematic top view (schematic plan view) of part of the touch sensor 22. FIG. 2B is an enlarged schematic top view of a region surrounded by dashed-dotted line in FIG. 2A.

As shown in FIGS. 2A and 2B, it is preferable that the conductive layer 23 be partly narrowed so that the width of a portion crossing the conductive layer 25 is small. Thus, the capacitance of the capacitor 11 can be reduced. In the case of using a self-capacitive touch sensor, the detection sensitivity can be increased more as the capacitance of the capacitor 11 is smaller.

Furthermore, it is preferable to provide, between the conductive layer 23 and the conductive layer 24 which are adjacent to each other, a conductive layer 26 which is electrically insulated from these conductive layers 23 and 24. The conductive layer 26 can suppress the formation of a thin portion of the touch sensor 22. For example, in the case where the conductive layer 23 and the conductive layer 24 are formed over the same flat surface, the conductive layer 26 formed in a manner similar to that of the conductive layer 23 and the conductive layer 24 can increase coverage of a thin film formed after the formation of these conductive layers; thus, a surface can be planarized. Furthermore, owing to the uniform thickness of the touch sensor 22, luminance unevenness of light emitted from the pixels through the touch sensor 22 can be reduced, so that the touch panel can achieve high display quality.

Figure 2C:
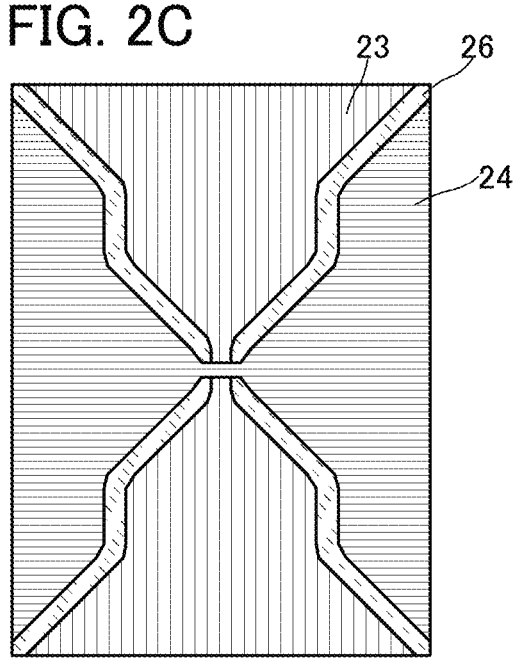

FIG. 2C shows the case where the conductive layer 23 and the conductive layer 24 are formed over different flat surfaces and the conductive layer 25 is not provided. At this time, the conductive layer 26 may be formed over the flat surface over which the conductive layer 23 or the conductive layer 24 is formed, or may be formed over a flat surface different from the flat surface over which the conductive layer 23 or the conductive layer 24 is formed. Note that the conductive layer 26 is not necessarily provided if not necessary.

Figure 3A:
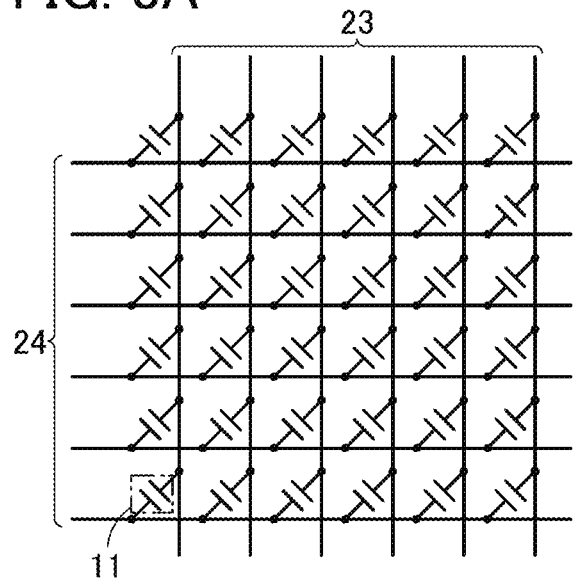
FIGS. 3A to 3C show structure examples of a touch sensor of an embodiment.

FIG. 3A shows an example of a circuit diagram of the touch sensor 22 including a plurality of conductive layers 23 and a plurality of conductive layers 24. In FIG. 3A, six conductive layers 23 and six conductive layers 24 are shown for simplicity, but the number of the conductive layers 23 and the number of the conductive layers 24 are not limited thereto.

One capacitor 11 is formed between one of the conductive layers 23 and one of the conductive layers 24. Therefore, capacitors 11 are arranged in a matrix.

In the case of a projected self-capacitive type, a pulse voltage is applied to each of the conductive layers 23 and 24 so that the conductive layers 23 and 24 are scanned, and the value of a current flowing in the conductive layer 23 or the conductive layer 24 at this time is sensed. The amount of current is changed when an object approaches, and therefore, positional information of the object can be obtained by sensing the difference between the values. In the case of a projected mutual-capacitive type, a pulse voltage is applied to one of the conductive layers 23 and 24 so that one of the conductive layers 23 and 24 is scanned, and a current flowing in the other is sensed to obtain positional information of the object.

The CR value of the conductive layer 23 or the conductive layer 24 is greater than 0 s and less than or equal to $1\times10^{-4}$ s, preferably greater than 0 s and less than or equal to $5\times10^{-5}$ s, more preferably greater than 0 s and less than or equal to $5\times10^{-6}$ s, still more preferably greater than 0 s and less than or equal to $5\times10^{-7}$ s, still more preferably greater than 0 s and less than or equal to $2\times10^{-7}$ s.

Figure 3B:
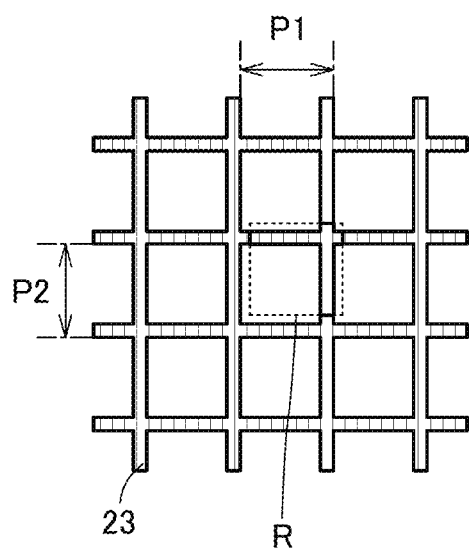

Each of the conductive layers 23 and 24 preferably has a lattice shape or a mesh shape having a plurality of openings. FIG. 3B shows an example of a top surface shape of part of the conductive layer 23.

Figure 3C:
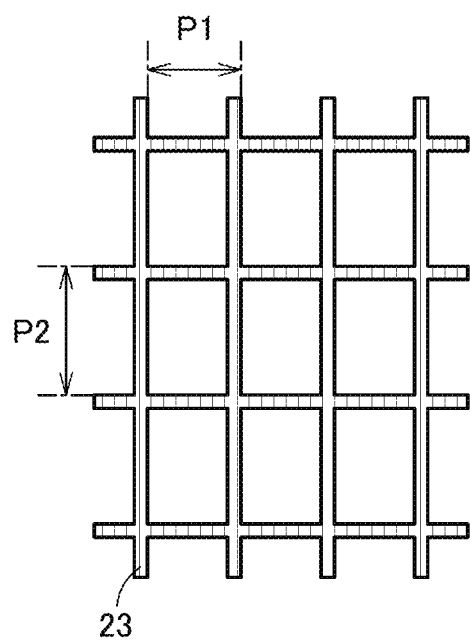

The conductive layer 23 shown in FIG. 3B has a lattice shape in which a distance P1 is provided in a lateral direction and a distance P2 is provided in a longitudinal direction. The distance P1 and the distance P2 are almost the same in FIG. 3B, but may be different from each other. For example, the distance P2 in a longitudinal direction may be larger than the distance P1 in a lateral direction as shown in FIG. 3C, or the distance P2 in a longitudinal direction may be smaller than the distance P1 in a lateral direction. The same can be said for the conductive layer 24.

The aperture ratio of the conductive layer 23 or the conductive layer 24 (the proportion of the opening area in the conductive layer 23 or the conductive layer 24 per unit area) is preferably higher than or equal to 20% and lower than 100%, more preferably higher than or equal to 30% and lower than 100%, still more preferably higher than or equal to 50% and lower than 100% in a region.

The aperture ratio can be easily calculated from the distance P1, the distance P2, and the width of the conductive layer. Alternatively, when a region R is assumed to be a periodic unit in FIG. 3B, the aperture ratio can be calculated from the ratio of the area of the region R to the area of the conductive layer 23 included in the region R. Here, the region R is a periodic unit of a periodic pattern of the conductive layer 23. By arranging regions R longitudinally and laterally in a periodic manner, the pattern of the conductive layer 23 can be formed.

In each of the conductive layer 23 and the conductive layer 24, the line width of a lattice is preferably greater than or equal to 50 nm and less than or equal to 100 μm, more preferably greater than or equal to 1 μm and less than or equal to 50 μm, still more preferably greater than or equal to 1 μm and less than or equal to 20 μm. The lattice having such a narrow line width allows adjacent pixels to be close to each other in the case where the opening overlaps with the pixel as described later. Consequently, the touch panel can have higher resolution and higher aperture ratio.

Figure 4A:
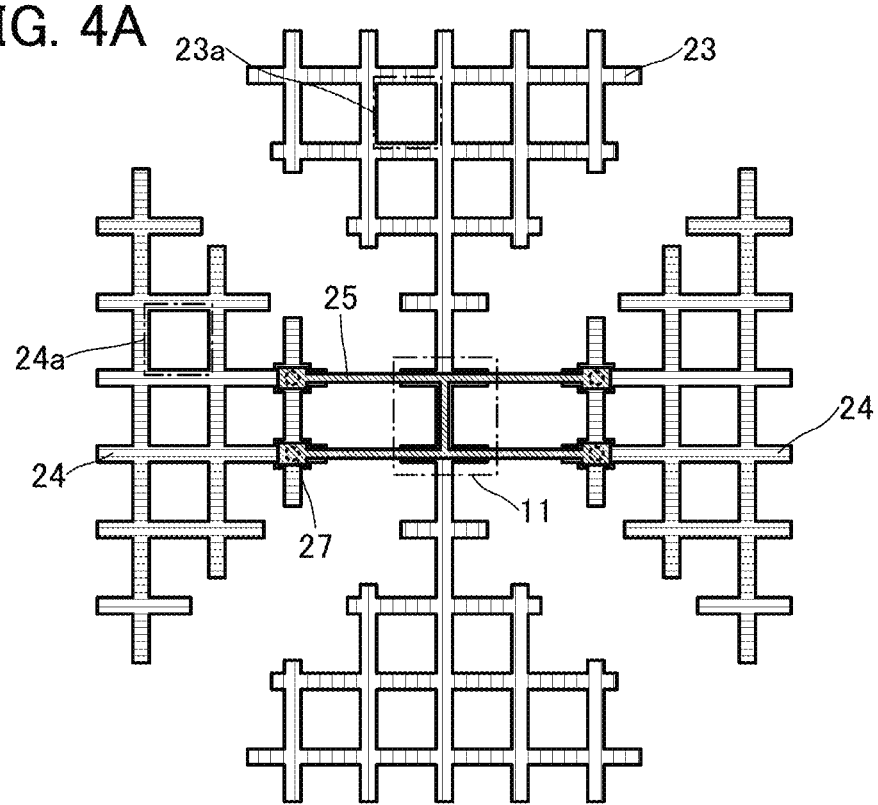
FIGS. 4A and 4B show structure examples of a touch sensor of an embodiment.

FIG. 4A is an enlarged schematic top view of a region indicated by a dashed-dotted line in FIG. 2B.

As shown in FIG. 4A, each of the conductive layers 23 and 24 preferably has a lattice shape (also referred to as a mesh shape). That is, each of the conductive layers 23 and 24 preferably has a plurality of openings (an opening 23a and an opening 24a). When the opening and the pixel are provided to overlap with each other as described later, light emitted from the display element in the pixel is not blocked by the conductive layer 23 and the conductive layer 24, or a reduction in the luminance of light due to the transmission through the conductive layer 23 and the conductive layer 24 does not occur. As a result, the touch sensor 22 can be used in the touch panel without a reduction in the aperture ratio of the pixel and the light extraction efficiency. It is preferable that the conductive layer 25 similarly have a shape not overlapping with the pixel.

In the structure shown in FIG. 4A, the conductive layer 24 and the conductive layer 25 are electrically connected to each other through openings 27 formed in an insulating layer positioned between the conductive layer 24 and the conductive layer 25. The capacitor 11 is formed in a portion where the conductive layer 23 and the conductive layer 25 overlap with each other.

As shown in FIG. 4A, the shape of the conductive layer 25 crossing the conductive layer 23 preferably has two or more portions shaped like strips whose long sides extend in a direction crossing the conductive layer 23. The plurality of strip-like portions can reduce contact resistance between the conductive layer 24 and the conductive layer 25. Furthermore, electrical connection between the conductive layer 25 and the conductive layer 24 can be kept even when part of the conductive layer 25 is broken or a contact failure occurs in a portion where the conductive layer 25 and the conductive layer 24 are connected to each other. Defects like the break and the contact failure might occur particularly when the touch panel is used while being bent; therefore, the conductive layer 25 preferably has the above-described shape.

Figure 4B:
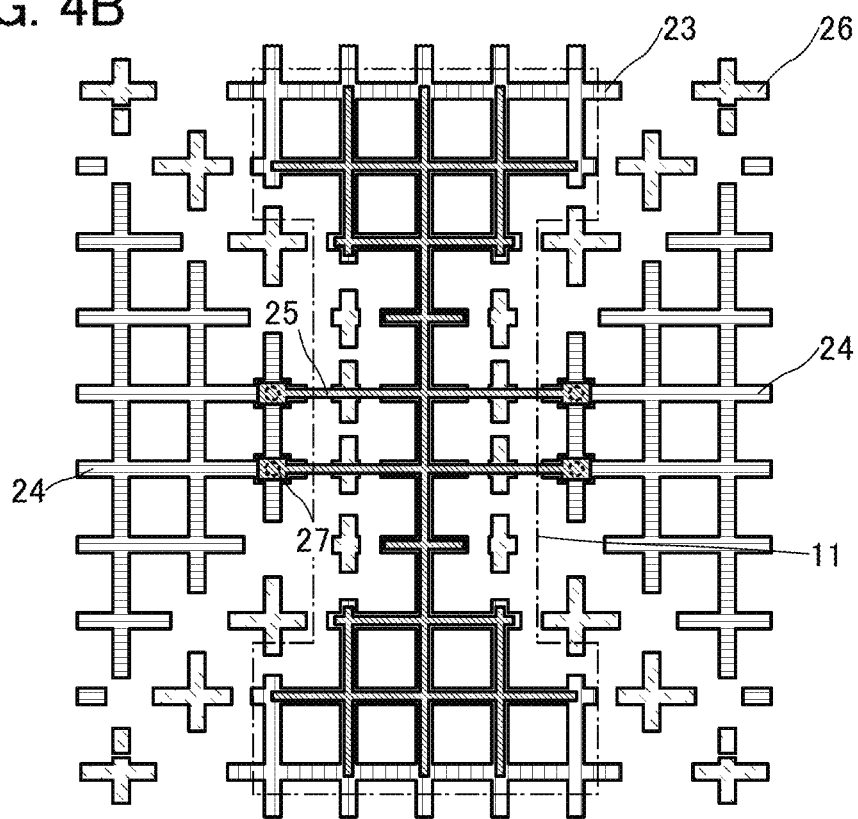

FIG. 4B shows an example of increasing the area where the conductive layer 23 and the conductive layer 25 overlap with each other. In the example, the conductive layer 25 overlaps with the conductive layer 23 not only in the portion where the conductive layer 23 and the conductive layer 25 cross each other but also in another portion, whereby the capacitance of the capacitor 11 can be increased. The capacitance of the capacitor 11 can be changed as appropriate by adjusting the area where the conductive layer 23 and the conductive layer 25 overlap with each other or the dielectric constant or the thickness of the insulating layer, for example.

Furthermore, in the example shown in FIG. 4B, the conductive layer 26 shown in FIGS. 2A to 2C is provided. As shown in FIG. 4B, a plurality of island-like patterns may be provided as the conductive layer 26.

Figure 5A:
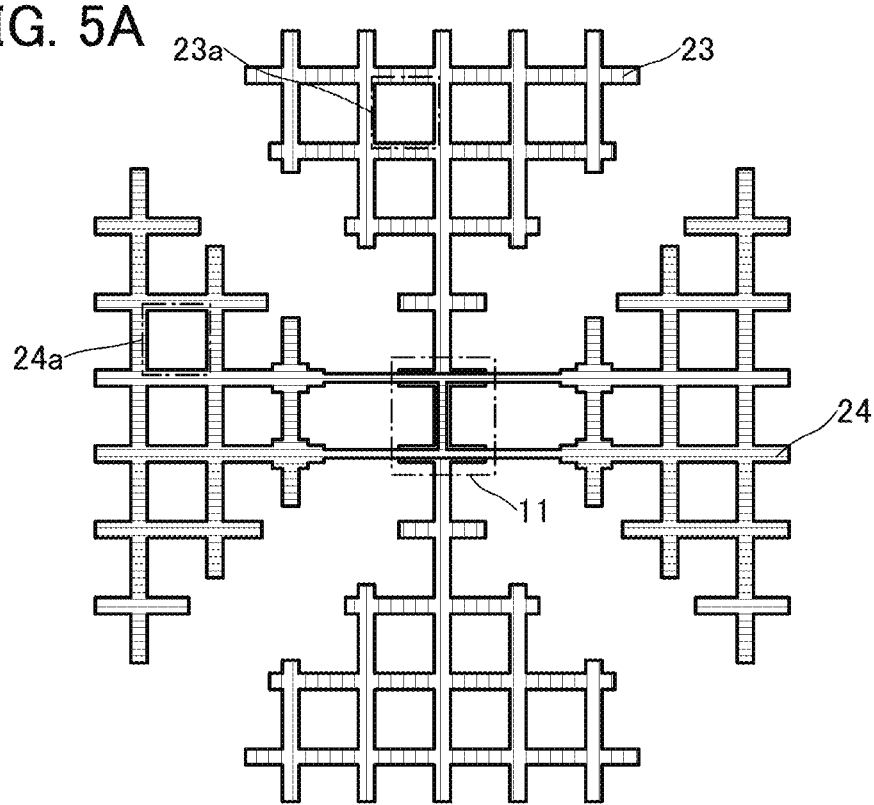
FIGS. 5A and 5B show structure examples of a touch sensor of an embodiment.
Figure 5B:
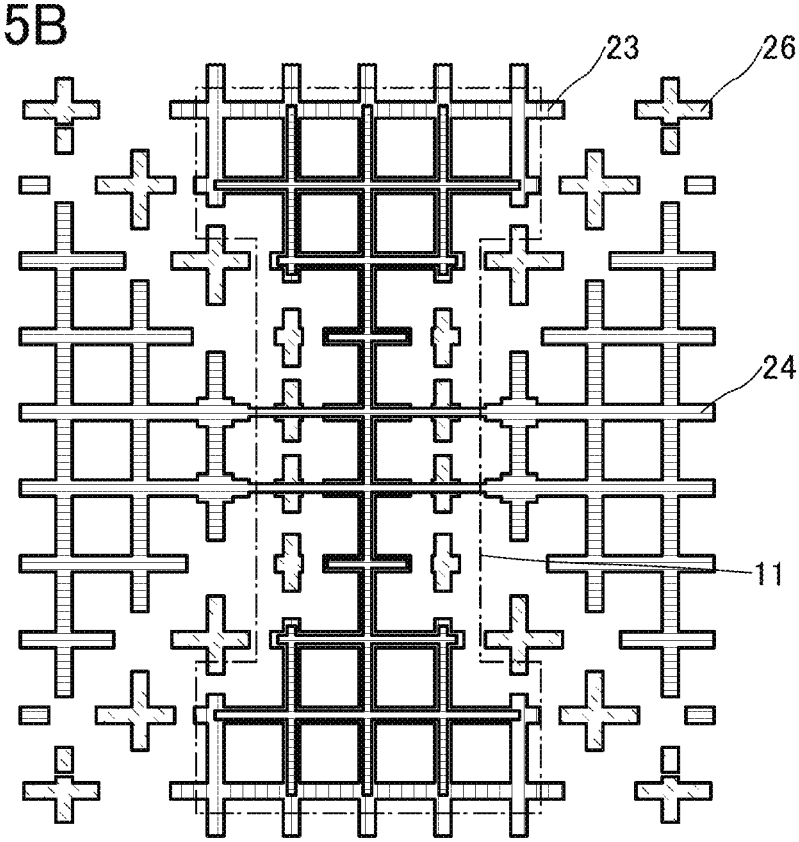

FIG. 5A shows an example where the conductive layer 25 is not provided in the structure shown in FIG. 4A. In FIG. 5A, the conductive layer 23 and the conductive layer 24 are provided to overlap with each other. FIG. 5B shows an example where the conductive layer 25 is not provided in the structure shown in FIG. 4B.

FIG. 6 shows an example of a boundary portion between the conductive layer 23 and the conductive layer 24. As shown in FIG. 6, an opening 22a surrounded by part of the conductive layer 23 and part of the conductive layer 24 may be formed in the boundary portion. Such a structure can significantly reduce the distance between the conductive layer 23 and the conductive layer 24 and can increase mutual capacitance therebetween. In particular, in the case of using a mutual capacitive type, the distance between the two conductive layers is preferably reduced to increase mutual capacitance.

Arrangement Example of Opening of Conductive Layer and Pixel

FIGS. 7A to 7G, FIG. 8, and FIGS. 9A to 9E are schematic views each showing the positional relationship between a pixel, sub-pixels included in the pixel, and the conductive layer 23 which are seen from the display surface side. Note that although the conductive layer 23 is shown in FIGS. 7A to 7G, FIG. 8, and FIGS. 9A to 9E as an example, the same applies to the conductive layer 24 and the conductive layer 25.

Figure 7A:
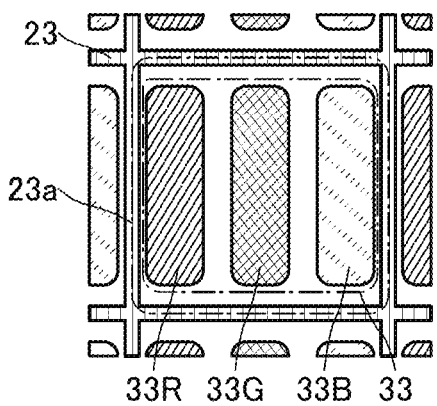
FIGS. 7A to 7G show structure examples of a touch panel of an embodiment.

In the example shown in FIG. 7A, the pixel 33 includes a sub-pixel 33R, a sub-pixel 33G, and a sub-pixel 33B. For example, the sub-pixel 33R, the sub-pixel 33G, and the sub-pixel 33B have a function of expressing red color, green color, and blue color, respectively. Note that the number and the colors of the sub-pixels included in the pixel 33 are not limited thereto.

The sub-pixels included in the pixel 33 each have a display element. Typical examples of the display element include light-emitting elements such as organic EL elements; liquid crystal elements; display elements (electronic ink) that perform display by an electrophoretic method, an electronic liquid powder (registered trademark) method, or the like; MEMS shutter display elements; and optical interference type MEMS display elements. The sub-pixel may have a transistor, a capacitor, a wiring that electrically connects the transistor and the capacitor, and the like in addition to the display element.

Furthermore, this embodiment can be used in a transmissive liquid crystal display, a transflective liquid crystal display, a reflective liquid crystal display, a direct-view liquid crystal display, or the like. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption. A structure suitable for employed display elements can be selected from among a variety of structures of pixel circuits.

In the structure shown in FIG. 7A, one opening 23a in the conductive layer 23 is provided to overlap with three sub-pixels, i.e., the sub-pixel 33R, the sub-pixel 33G, and the sub-pixel 33B. In this manner, the opening 23a in the conductive layer 23 is preferably provided to overlap with one pixel 33. In other words, the pixels 33 and the openings in the lattice of the conductive layer 23 are preferably provided at the same intervals. Such a structure allows the peripheral portions of the pixels 33 to have the same structures (e.g., the structures of films in the pixels and in the periphery of the pixels, the thicknesses of the films, and the unevenness of surfaces thereof), leading to a reduction in display unevenness.

Figure 8:
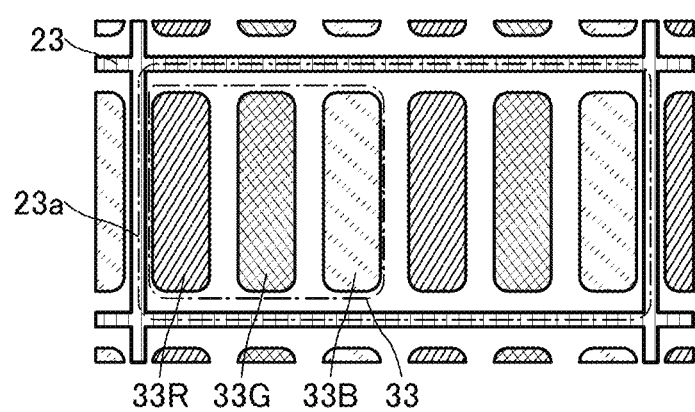
FIG. 8 shows a structure example of a touch panel of an embodiment.

Note that two or more pixels 33 and one opening 23a may overlap with each other as shown in FIG. 8, for example.

Figure 7B:
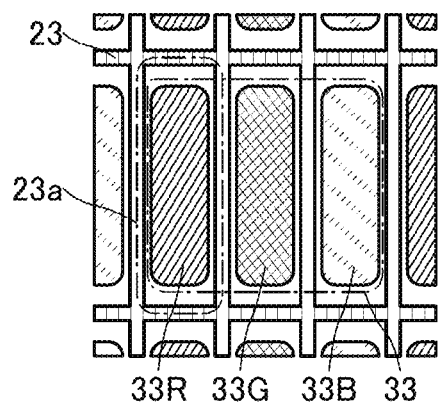

FIG. 7B shows an example where one opening 23a and one sub-pixel overlap with each other. When the conductive layer 23 is provided between two sub-pixels in one pixel 33 in a plan view, the wiring resistance of the conductive layer 23 can be reduced. Consequently, the detection sensitivity of the touch panel can be increased.

Figure 7C:
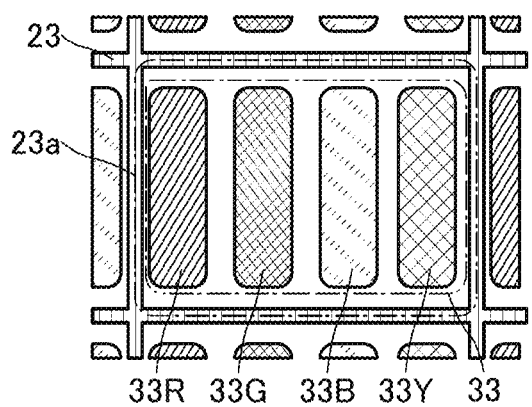

FIG. 7C shows an example where the pixel 33 further includes a sub-pixel 33Y in the structure shown in FIG. 7A. For example, a pixel capable of expressing yellow color can be used for the sub-pixel 33Y. Instead of the sub-pixel 33Y, a pixel capable of expressing white color may be used. When the pixel 33 includes sub-pixels of more than three colors, power consumption can be reduced.

Figure 7D:
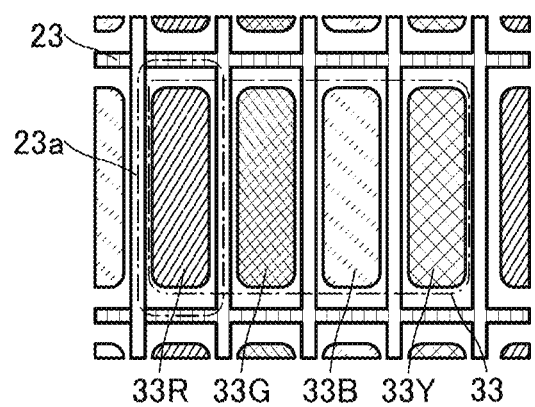

FIG. 7D shows an example where one opening 23a and one sub-pixel overlap with each other, i.e., an example where the conductive layer 23 is provided between two adjacent sub-pixels in a plan view. Note that a structure in which two of the four sub-pixels overlap with one opening 23a may be employed, although not shown.

Figure 7E:
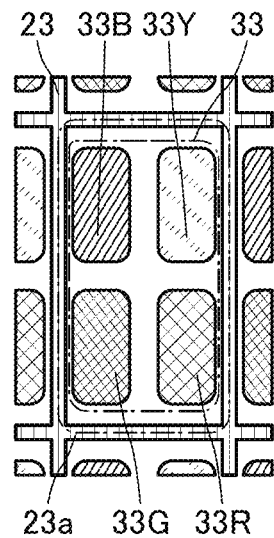
Figure 7F:
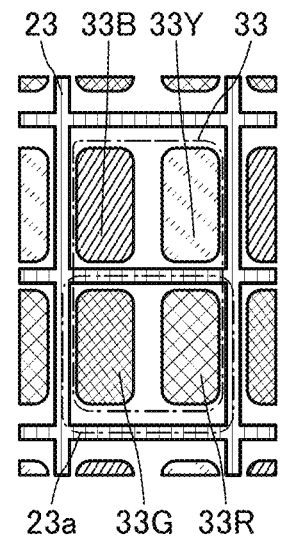
Figure 7G:
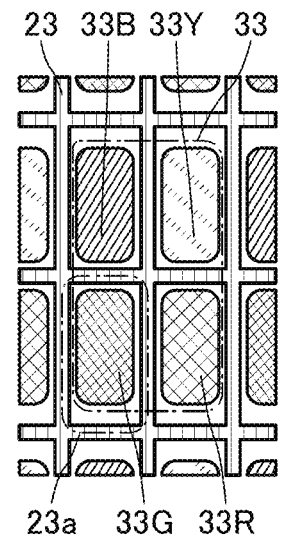

In the examples shown in FIGS. 7A to 7D, sub-pixels of each color are arranged in a stripe pattern. Alternatively, as shown in FIGS. 7E to 7G, sub-pixels of two colors may be alternated in one direction, for example. In a structure shown in FIG. 7E, the pixel 33 including four sub-pixels and one opening 23a overlap with each other. In a structure shown in FIG. 7F, two adjacent sub-pixels and one opening 23a overlap with each other. In a structure shown in FIG. 7G, one sub-pixel and one opening 23a overlap with each other.

Furthermore, the sub-pixels included in the pixel 33 may differ in size (e.g., the area of a region contributing to display). For example, the size of the sub-pixel of blue color with a relatively low luminosity factor can be set large, whereas the size of the sub-pixel of green or red color with a relatively high luminosity factor can be set small.

Figure 9A:
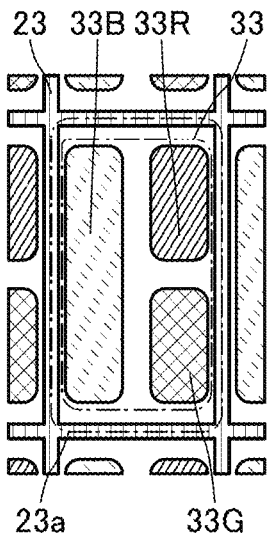
FIGS. 9A to 9E show structure examples of a touch panel of an embodiment.
Figure 9B:
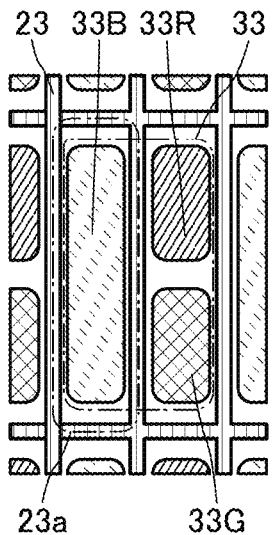

FIGS. 9A and 9B each show an example where the size of the sub-pixel 33B is larger than the size of the sub-pixel 33R and the size of the sub-pixel 33G. In the examples shown here, the sub-pixel 33R and the sub-pixel 33G are alternated. However, sub-pixels of each color may be arranged in a stripe pattern as shown in FIG. 7A and other drawings, and may have different sizes from each other.

FIG. 9A shows a structure in which the pixel 33 including three sub-pixels and one opening 23a overlap with each other. FIG. 9B shows a structure in which one opening 23a and one sub-pixel 33B overlap with each other and another opening 23a and two sub-pixels (the sub-pixel 33R and the sub-pixel 33G) overlap with each other.

Figure 9C:
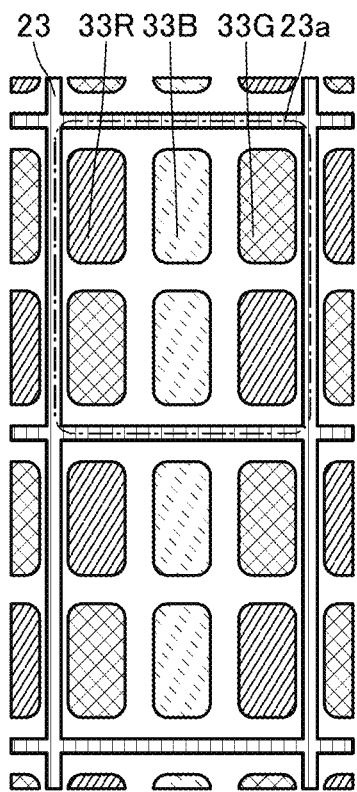
Figure 9D:
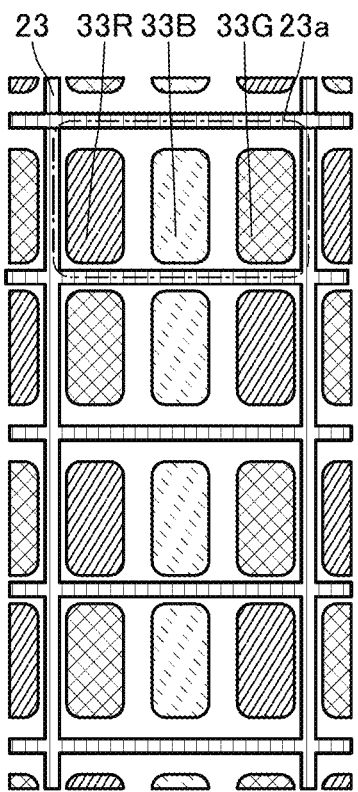
Figure 9E:
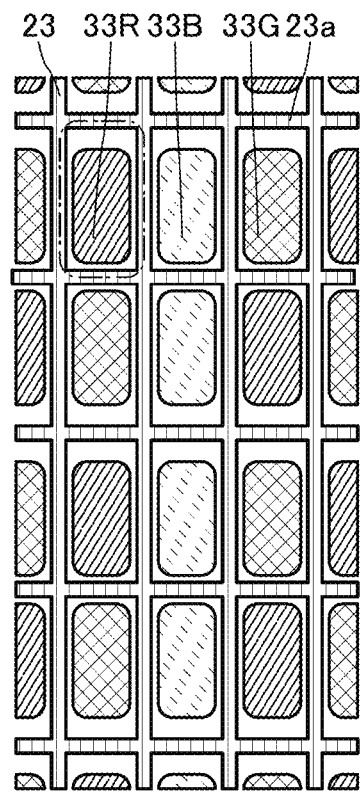

Alternatively, pixel structures as those shown in FIGS. 9C to 9E can be employed. Here, a column of the sub-pixels 33B arranged in a stripe pattern is provided between columns in each of which sub-pixels 33R and 33G are alternated. Furthermore, one sub-pixel 33B is provided between one sub-pixel 33R and one sub-pixel 33G.

In the structure shown in FIG. 9C, six sub-pixels (using two sub-pixels for each color) overlap with one opening 23a. In a structure shown in FIG. 9D, three sub-pixels (using one sub-pixel for each color) overlap with one opening 23a. In a structure shown in FIG. 9E, one sub-pixel and one opening 23a overlap with each other. Note that the pixel structure is not limited to the structures described here, and a structure in which two or more adjacent sub-pixels and one opening 23a overlap with each other may be employed.

Note that although the positional relationship between the conductive layer 23 and the sub-pixels is described here, the same applies to the conductive layer 24 and the conductive layer 25. That is, in the touch panel of one embodiment of the present invention, the opening 23a in the conductive layer 23 overlaps with one or more sub-pixels in a region and the opening 24a in the conductive layer 24 overlaps with one or more of the other sub-pixels in a region. Since each sub-pixel includes the display element as described above, it can be said that the opening 23a and the opening 24a each have a region overlapping with one or more display elements.

Stacked-Layer Structure Included in Touch Panel

Figure 10A:
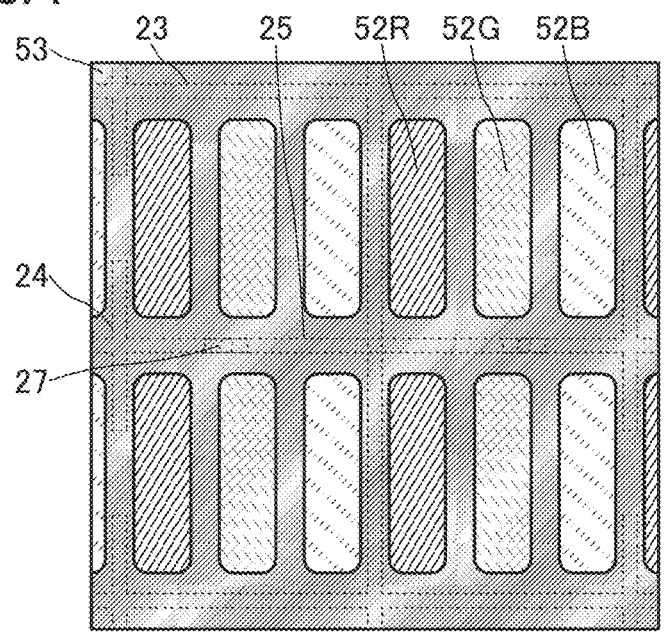
FIGS. 10A and 10B show a structure example of a touch panel of an embodiment.

FIG. 10A is a schematic top view of part of the touch panel when seen from the display surface side. In FIG. 10A, the conductive layer 23, the conductive layers 24, the conductive layer 25, a light-blocking layer 53, coloring layers 52R, 52G, and 52B, and the like are shown.

Figure 10B:
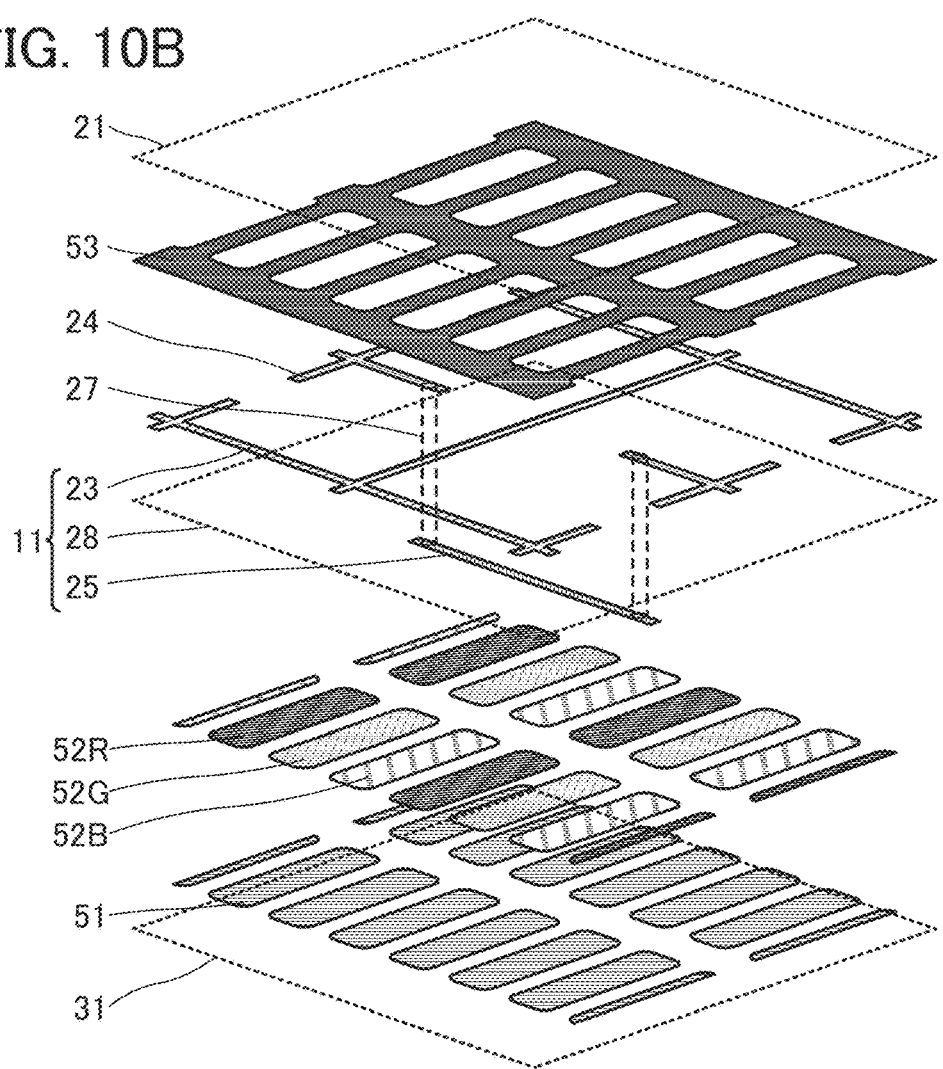

FIG. 10B is a developed schematic view of a stacked-layer structure of FIG. 10A. As shown in FIG. 10B, the light-blocking layer 53, the conductive layer 23, the conductive layers 24, an insulating layer 28, the conductive layer 25, the coloring layers 52R, 52G, and 52B, and display elements 51 are provided between the substrate 21 and the substrate 31.

Note that hereinafter, each of the coloring layers 52R, 52G, and 52B is also simply referred to as a coloring layer 52 in the case of describing common points of the coloring layers 52R, 52G, and 52B without distinguishing them.

Each coloring layer 52 has a function of transmitting light in a particular wavelength range. Here, the coloring layer 52R transmits red light, the coloring layer 52G transmits green light, and the coloring layer 52B transmits blue light. One of the display elements 51 and one of the coloring layers 52 are provided to overlap with each other, whereby only light in a particular wavelength range in light emitted from the display element can be transmitted to the substrate 21 side.

The light-blocking layer 53 has a function of blocking visible light. The light-blocking layer 53 is provided to overlap with a region between two adjacent coloring layers 52. In the example shown in FIGS. 10A and 10B, the light-blocking layer 53 has an opening provided to overlap with the display element 51 and the coloring layer 52.

As shown in FIG. 10B, the light-blocking layer 53 is preferably provided closer to the substrate 21 than the conductive layer 23, the conductive layers 24, and the conductive layer 25. That is, the light-blocking layer 53 is preferably provided closer to the display surface than these conductive layers. Furthermore, the light-blocking layer 53, the conductive layer 23, the conductive layers 24, and the conductive layer 25 preferably overlap with each other in a region. Such a structure allows the conductive layer 23, the conductive layers 24, and the conductive layer 25 to be less recognized visually by a user because these conductive layers are hidden by the light-blocking layer 53 when seen from the display surface side. Such a structure is effective particularly when the conductive layer 23, the conductive layers 24, and the conductive layer 25 are formed using a material reflecting visible light such as metal or alloy.

In the structure shown in FIG. 10B, the conductive layer 23, the conductive layer 25, and the insulating layer 28 provided therebetween form the capacitor 11. Furthermore, the two conductive layers 24 between which the conductive layer 23 is provided are electrically connected to the conductive layer 25 through the openings 27 formed in the insulating layer 28.

Each of the conductive layer 23, the conductive layer 24, and the conductive layer 25 is preferably provided between two adjacent display elements 51 in a plan view. Furthermore, each of the conductive layer 23, the conductive layer 24, and the conductive layer 25 is preferably provided between two adjacent coloring layers 52 in a plan view. Note that in the case where the area of the coloring layer 52 or the area of the display element 51 is larger than the opening area in the light-blocking layer 53, part of the conductive layer 23, the conductive layer 24, or the conductive layer 25 may overlap with the display element 51 or the coloring layer 52 in a region.

Note that in the example shown here, the coloring layer 52 is provided closer to the substrate 31 than the conductive layer 23 or the like; however, the coloring layer 52 may be provided closer to the substrate 21 than the conductive layer 23 or the like.

In the example shown in FIGS. 10A and 10B, the two conductive layers 24 between which the conductive layer 23 is provided are electrically connected to each other with the conductive layer 25. However, the conductive layer 25 is not necessarily provided as described above.

Figure 11A:
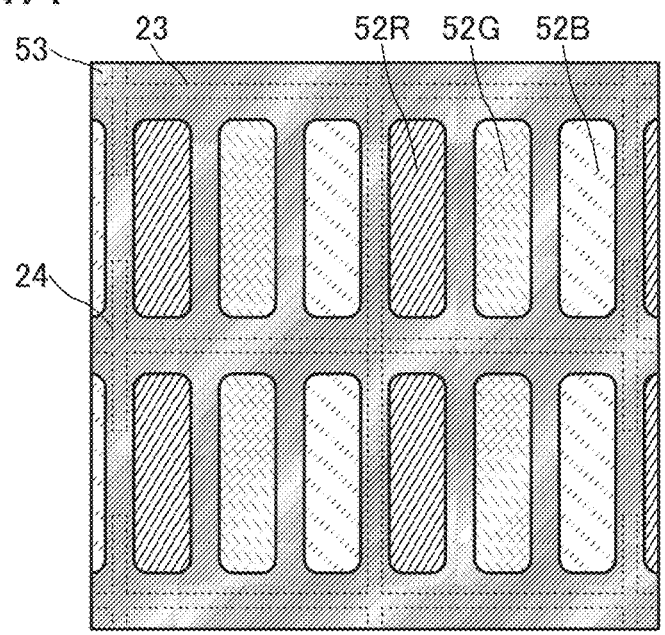
FIGS. 11A and 11B show a structure example of a touch panel of an embodiment.
Figure 11B:
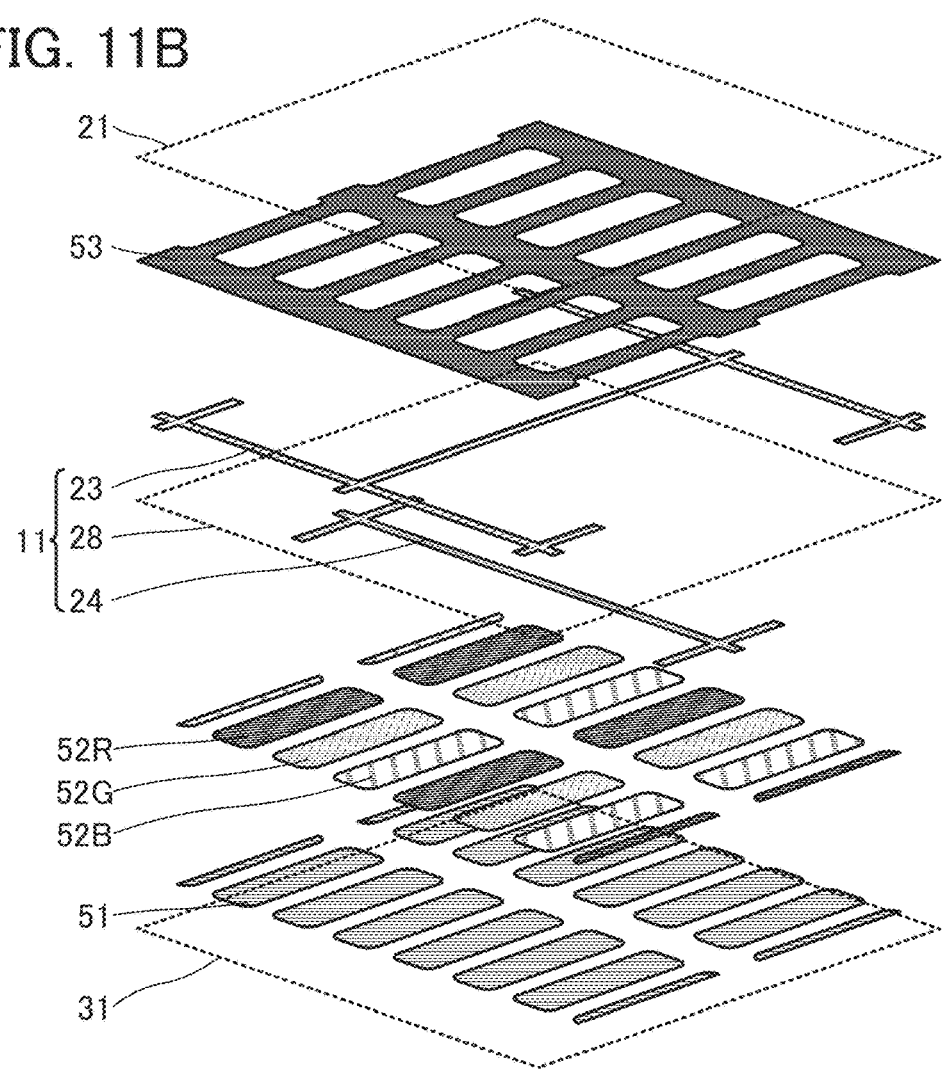

FIGS. 11A and 11B show a structure example of the case where the conductive layer 25 and the opening 27 are not provided in FIGS. 10A and 10B. As shown in FIG. 11B, the conductive layer 23, the conductive layer 24, and the insulating layer 28 provided therebetween form the capacitor 11.

The above is the description of the stacked-layer structure.

Cross-Sectional Structure Example

A cross-sectional structure example of the touch panel module 10 is described below.

Cross-Sectional Structure Example 1

FIG. 12A is a schematic cross-sectional view of a touch panel module of one embodiment of the present invention.

In the touch panel module shown in FIG. 12A, a capacitor of a touch sensor and a display element are provided between a pair of substrates, and therefore, the thickness of the touch panel module can be reduced.

The touch panel module has a structure in which the substrate 21 and the substrate 31 are bonded to each other with an adhesive layer 220. The conductive layer 23, the conductive layer 24, the conductive layer 25, and the insulating layer 28 which form a touch sensor, a contact portion 253, the coloring layer 52, the light-blocking layer 53, and the like are provided on the substrate 31 side of the substrate 21. A transistor 201, a transistor 202, a transistor 203, a light-emitting element 204, a contact portion 205, and the like are provided on the substrate 21 side of the substrate 31.

An insulating layer 212, an insulating layer 213, an insulating layer 214, an insulating layer 215, an insulating layer 216, an insulating layer 217, an insulating layer 218, a spacer 219, a conductive layer 225, and the like are provided over the substrate 31 with an adhesive layer 211 provided therebetween.

The light-emitting element 204 is provided over the insulating layer 217. The light-emitting element 204 includes a first electrode 221, an EL layer 222, and a second electrode 223 (see FIG. 12B). An optical adjustment layer 224 is provided between the first electrode 221 and the EL layer 222. The insulating layer 218 is provided to cover end portions of the first electrode 221 and the optical adjustment layer 224.

In FIG. 12A, the transistor 201 for controlling current and the transistor 202 for controlling switching are provided in the pixel 33. One of a source and a drain of the transistor 201 is electrically connected to the first electrode 221 through the conductive layer 225.

In FIG. 12A, the transistor 203 is provided in the circuit 34.

In the example illustrated in FIG. 12A, the transistors 201 and 203 each have a structure in which a semiconductor layer where a channel is formed is provided between two gate electrodes. Such transistors can have a higher field-effect mobility and thus have higher on-state current than other transistors. Consequently, a circuit capable of high-speed operation can be obtained. Furthermore, the area occupied by a circuit portion can be reduced. The use of the transistor having high on-state current can reduce signal delay in wirings and can suppress display unevenness even in a display panel or a touch panel in which the number of wirings is increased because of increase in size or resolution.

Note that the transistor included in the circuit 34 and the transistor included in the pixel 33 may have the same structure. Transistors included in the circuit 34 may have the same structure or different structures. Transistors included in the pixel 33 may have the same structure or different structures.

The light-emitting element 204 has a top-emission structure and emits light to the second electrode 223 side. The transistors 201 and 202, a capacitor, a wiring, and the like are provided to overlap with the light-emitting region of the light-emitting element 204. Thus, an aperture ratio of the pixel 33 can be increased.

Figure 13:
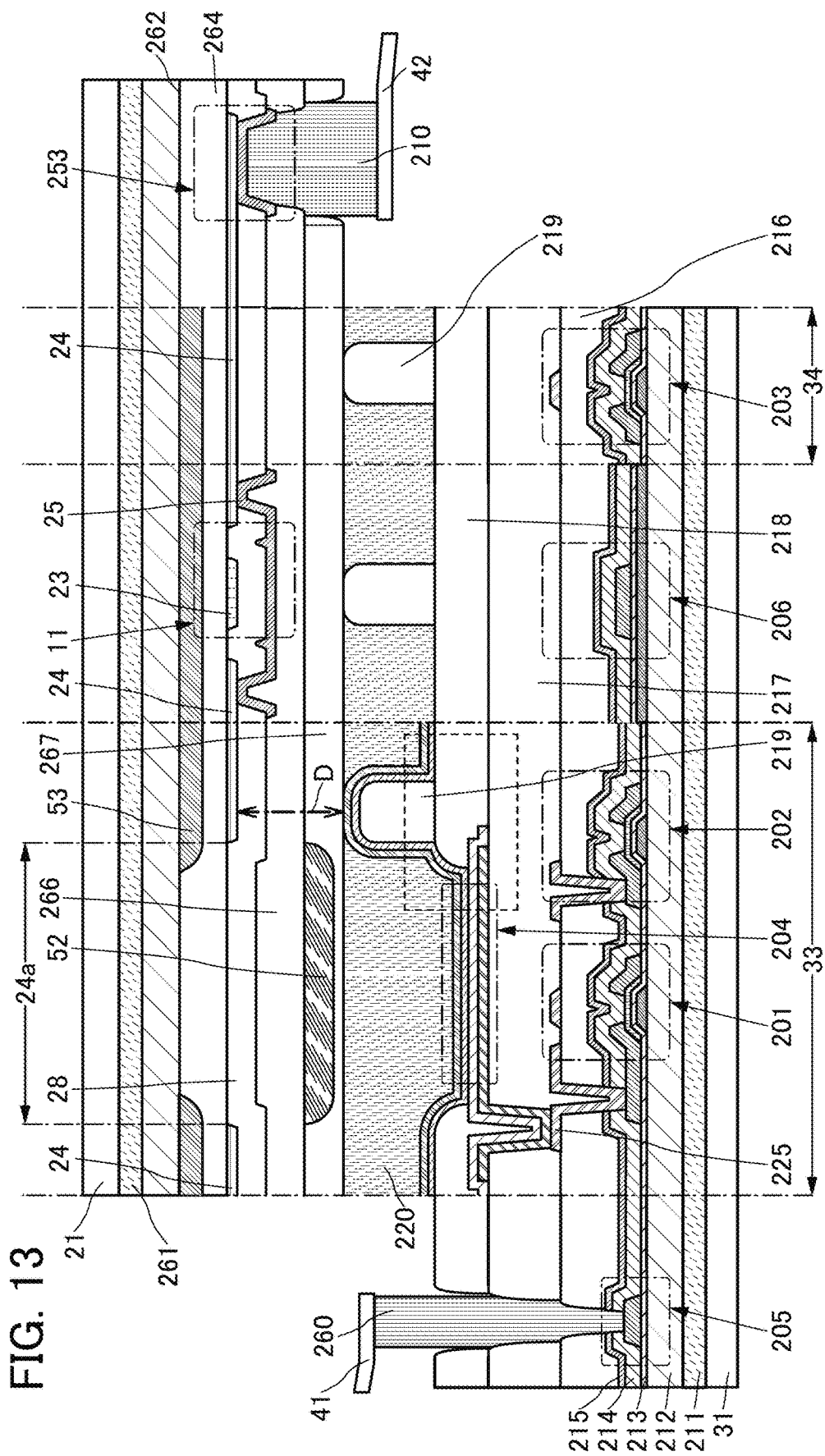
FIG. 13 shows a structure example of a touch panel of an embodiment.

The spacer 219 is provided over the insulating layer 218 and has a function of adjusting the distance between the substrate 31 and the substrate 21. In FIG. 12A, the spacer 219 and an overcoat 267 of the substrate 21 are provided with a gap therebetween. Alternatively, as shown in FIG. 13, components such as the overcoat 267 on the substrate 21 side may be in contact with the second electrode 223 over the spacer 219 in a region. Furthermore, as shown in FIG. 13, the spacer 219 may also be provided outside the pixel 33, e.g., in a region overlapping with the circuit 34 or in a peripheral portion of the substrate 21 or the substrate 31. Although the spacer 219 is formed on the substrate 31 side in the structure described here, the spacer 219 may be formed on the substrate 21 side. For example, the spacer 219 may be provided on an insulating layer 266, the overcoat 267, the coloring layer 52, or the like.

Figure 14:
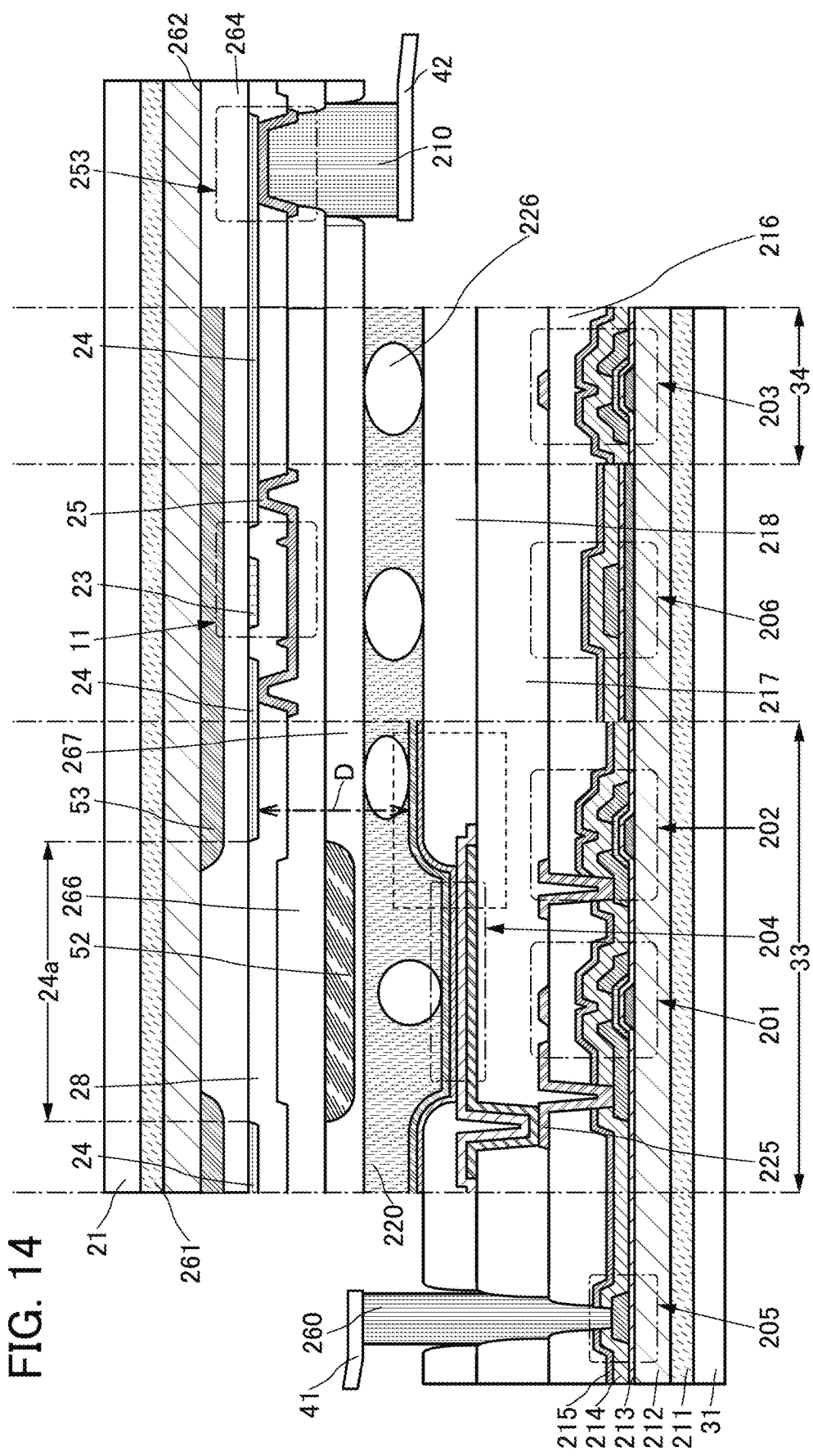
FIG. 14 shows a structure example of a touch panel of an embodiment.

As shown in FIG. 14, a spherical spacer 226 may be used instead of the spacer 219. A light-transmitting material or a light-absorbing material may be used for the spherical spacer 226. Although a material such as silica can be used for the spacer 226, an elastic material such as an organic resin or rubber is preferably used. In FIG. 14, the spacer 226 having elasticity is deformed and seems to be pressed from above and below.

An insulating layer 262, the light-blocking layer 53, an insulating layer 264, the conductive layer 23, the conductive layer 24, the insulating layer 28, the conductive layer 25, the insulating layer 266, the coloring layer 52, and the like are provided on the substrate 31 side of the substrate 21 with an adhesive layer 261 provided between the substrate 21 and them. Furthermore, the overcoat 267 covering the coloring layer 52 may be provided.

The light-blocking layer 53 is provided closer to the substrate 31 than the insulating layer 262. The light-blocking layer 53 has the opening, and the opening is provided to overlap with the light-emitting region of the light-emitting element 204.

As examples of a material that can be used for the light-blocking layer 53, carbon black, a metal oxide, and a composite oxide containing a solid solution of a plurality of metal oxides can be given. Stacked films containing the material of the coloring layer 52 are preferably used for the light-blocking layer 53. For example, a material containing an acrylic resin can be used for each coloring layer, and a stacked-layer structure of a film containing the material of the coloring layer 52R transmitting red light and a film containing the material of the coloring layer 52B transmitting blue light can be employed. Formation of the coloring layer 52 and the light-blocking layer 53 using the same material can reduce a manufacturing cost because the same manufacturing apparatus can be used.

As examples of a material that can be used for the coloring layer 52, a metal material, a resin material, and a resin material containing a pigment or dye can be given.

The insulating layer 264 is provided to cover the light-blocking layer 53. The insulating layer 264 may have a function of a planarization film. In the case where a material with low heat resistance is used for the light-blocking layer 53, an organic insulating material is preferably used for the insulating layer 264 because a layer with high planarity can be formed at a low temperature. Alternatively, an inorganic insulating material is preferably used for the insulating layer 264 because the insulating layer 264 can function as an etching stopper at the time of processing the conductive layer 23 and the conductive layer 24.

Each of the conductive layer 23 and the conductive layer 24 is provided to cover part of the insulating layer 264. Each of the conductive layer 23 and the conductive layer 24 overlaps with the light-blocking layer 53 in a region. In FIG. 12A, the example where the conductive layer 24 is provided in part of a region of the pixel 33 is shown. The opening 24a in the conductive layer 24 overlaps with the light-emitting element 204 in a region. In the pixel 33, the conductive layer 24 is provided to surround the light-emitting region of the light-emitting element 204. Therefore, the conductive layer 24 may overlap with, for example, the spacer 219, the insulating layer 218, the conductive layer 225, the transistor 201, the transistor 202, or a wiring electrically connected to the transistor 201 or 202 in a region. The same applies to the conductive layer 23 and the conductive layer 25.

In the example shown in FIG. 12A, the conductive layer 23 and the conductive layer 24 are processed using the same conductive film. Since the conductive layer 23 and the conductive layer 24 are formed over the entire display region, formation of the conductive layers in the same step can reduce display unevenness.

The insulating layer 28 has a function of a dielectric of the capacitor 11. In the example shown in FIG. 12A, an inorganic insulating material is used for the insulating layer 28. When the insulating layer 28 is formed using an inorganic insulating material, the insulating layer 28 having a uniform thickness can be formed easily, and furthermore, the insulating layer 28 can be thinner than the case of using an organic insulating material. Therefore, variation in the capacitances of the capacitors 11 can be reduced. Like the insulating layer 264, the insulating layer 28 can function as an etching stopper at the time of processing the conductive layer 25. Note that the insulating layer 28 may be formed using an organic insulating material. In this case, a material with low heat resistance can be used for components between the substrate 21 and the insulating layer 28, and therefore, the range of choices of materials thereof can be expanded.

The conductive layer 25 is provided to cover part of the insulating layer 28. The conductive layer 25 is provided to overlap with the light-blocking layer 53. Part of the conductive layer 25 overlaps with the conductive layer 23 in a region. The conductive layer 25 has a function of electrically connecting the two conductive layers 24 between which the conductive layer 23 is provided, through the openings formed in the insulating layer 28.

The insulating layer 266 is provided to cover the conductive layer 25 and the insulating layer 28, and the coloring layer 52 is provided to cover part of the insulating layer 266. The overcoat 267 may be provided to cover the coloring layer 52.

It is preferable that the insulating layer 266 have a function of a planarization layer and be formed using an organic insulating material. Alternatively, an inorganic insulating material having high planarity may be used. A flat surface provided by the insulating layer 266 can reduce a variation in the thickness of the coloring layer 52. Thus, the touch panel can have high display quality.

When a flexible substrate is used for at least one of the substrates 21 and 31, the touch panel can be thin and lightweight. When a flexible substrate is used for each of the substrates 21 and 31, the touch panel can be flexible.

A color filter method is employed in the touch panel shown in FIGS. 12A and 12B. For example, a structure where pixels of three colors of red (R), green (G), and blue (B) express one color can be employed for the coloring layer 52. In addition, a pixel of white (W) or yellow (Y) may be used for the structure.

An EL layer that emits white light is preferably used as the EL layer 222 of the light-emitting element 204. By using the light-emitting element 204, it is not necessary to separately form the EL layers 222 expressing different colors in pixels. Therefore, the cost can be reduced, and the high resolution is achieved easily. Furthermore, by varying the thickness of the optical adjustment layer 224 in pixels, light with a wavelength suitable for each pixel can be extracted, which increases color purity. Note that the EL layers 222 expressing different colors may be separately formed in pixels, in which case the optical adjustment layer 224 is not necessarily used.

An opening is provided in the insulating layers and the like in a region overlapping with the contact portion 205 provided over the substrate 31, and the contact portion 205 and the FPC 41 are electrically connected to each other with a connection layer 260 provided in the opening. Furthermore, an opening is provided in the insulating layers and the like in a region overlapping with the substrate 21, and the contact portion 253 and the FPC 42 are electrically connected to each other through a connection layer 210 provided in the opening.

Note that as shown in FIG. 13 or FIG. 14, a structure in which the FPC 41 and the connection layer 260 do not overlap with the substrate 21 and the insulating layer and the like provided for the substrate 21 may be employed. Similarly, in the structures shown in FIG. 13 and FIG. 14, the FPC 42 and the connection layer 210 do not overlap with the substrate 31 and the insulating layer and the like provided for the substrate 31.

In the structure shown in FIG. 12A, the contact portion 205 has a conductive layer formed by processing a conductive film that is also used for the source electrode and the drain electrode of the transistor. Furthermore, the contact portion 253 has a stacked-layer structure of a conductive layer formed by processing a conductive film that is also used for the conductive layer 23 and the conductive layer 24, and a conductive layer formed by processing a conductive film that is also used for the conductive layer 25. The contact portion preferably has a stacked-layer structure of a plurality of conductive layers as described above because electric resistance can be reduced and mechanical strength can be increased.

Furthermore, FIG. 12A shows a cross-sectional structure of a crossing portion 206 where a wiring formed by processing the conductive film used for forming the gate electrode of the transistor and a wiring formed by processing the conductive film used for forming the source electrode and the drain electrode of the transistor cross each other.

As the connection layer 210 and the connection layer 260, any of various anisotropic conductive films (ACF), anisotropic conductive pastes (ACP), or the like can be used.

A material in which impurities such as water or hydrogen do not easily diffuse is preferably used for the insulating layer 212 and the insulating layer 262. That is, the insulating layer 212 and the insulating layer 262 can each function as a barrier film. Such a structure can effectively suppress diffusion of the impurities to the light-emitting element 204 and the transistors even in the case of using a material permeable to moisture for the substrate 21 and the substrate 31, and a highly reliable touch panel can be achieved.

Here, the distance between one of the conductive layer 23 and the conductive layer 24 (or the conductive layer 25) which is positioned closer to the display panel (i.e., the substrate side on which the display element is provided) than the other and a conductive layer which is the closest to the one of the conductive layer 23 and the conductive layer 24 (or the conductive layer 25) of the conductive layers provided closer to the display panel than the one of the conductive layer 23 and the conductive layer 24 (or the conductive layer 25) is preferably greater than or equal to 25 nm and less than or equal to 100 µm, more preferably greater than or equal to 50 nm and less than or equal to 10 µm, still more preferably greater than or equal to 50 nm and less than or equal to 5 µm.

In the example shown in FIG. 12A, the second electrode 223 of the light-emitting element 204 corresponds to the conductive layer which is the closest to the conductive layer 24 in a region of the pixel 33 of the conductive layers provided closer to the display panel than the conductive layer 24. Here, the distance between the conductive layer 24 and the second electrode 223 is denoted by D. As the distance D is shorter, a distance between the pair of substrates can be reduced more, and the thickness of the touch panel can be reduced more. In particular, when flexible substrates are used as the pair of substrates, the touch panel can be flexible and strong against bending.

Note that the conductive layer which is the closest to the conductive layer 23 or 24 of the conductive layers provided closer to the display panel than the conductive layer 23 or 24 is not limited to the second electrode 223 and may be a conductive layer other than the second electrode 223. For example, in the case where another conductive layer is provided between the second electrode 223 and the conductive layer 23 or 24, the distance between the conductive layer and the conductive layer 23 or 24 is set within the above-described range. For example, a conductive layer can be provided on the insulating layer 266 so that the adhesive layer 220 can be formed on a surface with higher wettability or higher adhesion.

Components

The above components are described below.

The transistor includes a conductive layer functioning as the gate electrode, the semiconductor layer, a conductive layer functioning as the source electrode, a conductive layer functioning as the drain electrode, and an insulating layer functioning as a gate insulating layer. FIG. 12A shows the case where a bottom-gate transistor is used.

Note that there is no particular limitation on the structure of the transistor included in the touch panel of one embodiment of the present invention. For example, a forward staggered transistor or an inverted staggered transistor may be used. A top-gate transistor or a bottom-gate transistor may be used. A semiconductor material used for the transistor is not particularly limited, and for example, an oxide semiconductor, silicon, or germanium can be used.

There is no particular limitation on the crystallinity of a semiconductor material used for the transistor, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be suppressed.

As a semiconductor material for the semiconductor layer of the transistor, an element of Group 14, a compound semiconductor, or an oxide semiconductor can be used, for example. Typically, a semiconductor containing silicon, a semiconductor containing gallium arsenide, an oxide semiconductor containing indium, or the like can be used.

An oxide semiconductor is preferably used as a semiconductor in which a channel of the transistor is formed. In particular, an oxide semiconductor having a wider band gap than silicon is preferably used. A semiconductor material having a wider band gap and a lower carrier density than silicon is preferably used because off-state current of the transistor can be reduced.

For example, the oxide semiconductor preferably contains at least indium (In) or zinc (Zn). The oxide semiconductor more preferably contains an In—M—Zn-based oxide (M is a metal such as Al, Ti, Ga, Ge, Y, Zr, Sn, La, Ce, or Hf).

As the semiconductor layer, it is particularly preferable to use an oxide semiconductor film including a plurality of crystal parts whose c-axes are aligned substantially perpendicular to a surface on which the semiconductor layer is formed or the top surface of the semiconductor layer and having no grain boundary between adjacent crystal parts.

There is no grain boundary in such an oxide semiconductor; thus, generation of a crack in an oxide semiconductor film which is caused by stress when a display panel is bent is prevented. Therefore, such an oxide semiconductor can be preferably used for a flexible touch panel which is used in a bent state, or the like.

Moreover, the use of such an oxide semiconductor for the semiconductor layer makes it possible to provide a highly reliable transistor in which a change in the electrical characteristics is suppressed.

Charge accumulated in a capacitor through a transistor can be held for a long time because of the low off-state current of the transistor. When such a transistor is used for a pixel, operation of a driver circuit can be stopped while a gray scale of an image displayed in each display region is maintained. As a result, a display device with an extremely low power consumption can be obtained.

Alternatively, silicon is preferably used as a semiconductor in which a channel of a transistor is formed. Although amorphous silicon may be used as silicon, silicon having crystallinity is particularly preferable. For example, microcrystalline silicon, polycrystalline silicon, single crystal silicon, or the like is preferably used. In particular, polycrystalline silicon can be formed at a lower temperature than single crystal silicon and has higher field effect mobility and higher reliability than amorphous silicon. When such a polycrystalline semiconductor is used for a pixel, the aperture ratio of the pixel can be improved. Even in the case where pixels are provided at extremely high resolution, a gate driver circuit and a source driver circuit can be formed over a substrate over which the pixels are formed, and the number of components of an electronic appliance can be reduced.

As conductive layers such as a gate, a source, and a drain of the transistor and a wiring and an electrode in the touch panel, a single-layer structure or a stacked-layer structure using any of metals such as aluminum, titanium, chromium, nickel, copper, yttrium, zirconium, molybdenum, silver, tantalum, and tungsten, or an alloy containing any of these metals as its main component can be used. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used. Copper containing manganese is preferably used because controllability of a shape by etching is increased.

As a light-transmitting conductive material, a conductive oxide such as indium oxide, indium tin oxide, indium zinc oxide, zinc oxide, or zinc oxide to which gallium is added, or graphene can be used. Alternatively, a metal material such as gold, silver, platinum, magnesium, nickel, tungsten, chromium, molybdenum, iron, cobalt, copper, palladium, or titanium, or an alloy material containing any of these metal materials can be used. Alternatively, a nitride of the metal material (e.g., titanium nitride) or the like may be used. In the case of using the metal material or the alloy material (or the nitride thereof), the thickness is set small enough to be able to transmit light. Alternatively, a stack of any of the above materials can be used as the conductive layer. For example, a stack of indium tin oxide and an alloy of silver and magnesium is preferably used because the conductivity can be increased.

Examples of an insulating material that can be used for the insulating layers, the overcoat 267, the spacer 219, and the like include a resin such as acrylic or epoxy resin, a resin having a siloxane bond, and an inorganic insulating material such as silicon oxide, silicon oxynitride, silicon nitride oxide, silicon nitride, or aluminum oxide.

As described above, the light-emitting element is preferably provided between a pair of insulating films with low water permeability. Thus, an impurity such as water can be prevented from entering the light-emitting element, leading to prevention of a decrease in the reliability of the light-emitting device.

As an insulating film with low water permeability, a film containing nitrogen and silicon (e.g., a silicon nitride film or a silicon nitride oxide film), a film containing nitrogen and aluminum (e.g., an aluminum nitride film), or the like can be used. Alternatively, a silicon oxide film, a silicon oxynitride film, an aluminum oxide film, or the like can be used.

For example, the water vapor transmittance of the insulating film with low water permeability is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], still further preferably lower than or equal to $1\times10^{-8}$ [g/(m$^2$·day)].

For the adhesive layers, a curable resin such as a heat curable resin, a photocurable resin, or a two-component type curable resin can be used. For example, a resin such as an acrylic resin, a urethane resin, an epoxy resin, or a resin having a siloxane bond can be used.

The EL layer 222 includes at least a light-emitting layer. In addition to the light-emitting layer, the EL layer 222 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 222, either a low molecular compound or a high molecular compound can be used, and an inorganic compound may be used. Each of the layers included in the EL layer 222 can be formed by any of the following methods: an evaporation method (including a vacuum evaporation method), a transfer method, a printing method, an inkjet method, a coating method, and the like.

In the case where a light-emitting element emitting white light is used as the light-emitting element 204, the EL layer 222 preferably contains two or more kinds of light-emitting substances. For example, light-emitting substances are selected so that two or more light-emitting substances emit complementary colors to obtain white light emission. Specifically, it is preferable to contain two or more selected from light-emitting substances emitting light of red (R), green (G), blue (B), yellow (Y), orange (O), and the like and light-emitting substances emitting light containing two or more of spectral components of R, G, and B. The light-emitting element 204 preferably emits light with a spectrum having two or more peaks in the wavelength range of a visible light region (e.g., 350 nm to 750 nm). An emission spectrum of a material emitting light having a peak in the wavelength range of a yellow light preferably includes spectral components also in the wavelength range of a green light and a red light.

More preferably, a light-emitting layer containing a light-emitting material emitting light of one color and a light-emitting layer containing a light-emitting material emitting light of another color are stacked in the EL layer 222. For example, the plurality of light-emitting layers in the EL layer 222 may be stacked in contact with each other or may be stacked with a separation layer therebetween. For example, a separation layer may be provided between a fluorescent layer and a phosphorescent layer.

The separation layer can be provided to prevent an energy transfer by the Dexter mechanism (particularly triplet energy transfer) from a phosphorescent material or the like in an excited state which is generated in the phosphorescent layer to a fluorescent material or the like in the fluorescent layer. The thickness of the separation layer may be approximately several nanometers, specifically 0.1 nm or more and 20 nm or less, 1 nm or more and 10 nm or less, or 1 nm or more and 5 nm or less. The separation layer contains a single material (preferably a bipolar material) or a plurality of materials (preferably, a hole-transport material and an electron-transport material).

The separation layer may be formed using a material contained in the light-emitting layer in contact with the separation layer. This facilitates the manufacture of the light-emitting element and reduces the drive voltage. For example, in the case where the phosphorescent layer contains a host material, an assist material, and the phosphorescent material (a guest material), the separation layer may contain the host material and the assist material. In other words, the separation layer includes a region which does not contain the phosphorescent material, while the phosphorescent layer includes a region containing the phosphorescent material. Thus, the separation layer and the phosphorescent layer can be separately deposited depending on the presence of the phosphorescent material. Furthermore, such a structure enables the separation layer and the phosphorescent layer to be deposited in the same chamber, which leads to a reduction in manufacturing cost.

The light-emitting element 204 may be a single element including one EL layer or a tandem element in which a plurality of EL layers are stacked with a charge generation layer therebetween.

Manufacturing Method Example

Here, a method for manufacturing a flexible touch panel is described.

For convenience, a structure including a pixel and a circuit, a structure including an optical member such as a color filter, or a structure including a touch sensor is referred to as an element layer. An element layer includes a display element, for example, and may include a wiring electrically connected to the display element or an element such as a transistor used in a pixel or a circuit in addition to the display element.

Here, a support body (e.g., the substrate 21 or the substrate 31) with an insulating surface where an element layer is formed is referred to as a base material.

As a method for forming an element layer over a flexible base material provided with an insulating surface, there are a method in which an element layer is formed directly over a base material, and a method in which an element layer is formed over a supporting base material that has stiffness and then the element layer is separated from the supporting base material and transferred to the base material.

In the case where a material of the base material can withstand heating temperature in a process for forming the element layer, it is preferable that the element layer be formed directly over the base material, in which case a manufacturing process can be simplified. At this time, the element layer is preferably formed in a state where the base material is fixed to the supporting base material, in which case transfer thereof in an apparatus and between apparatuses can be easy.

In the case of employing the method in which the element layer is formed over the supporting base material and then transferred to the base material, first, a separation layer and an insulating layer are stacked over the supporting base material, and then the element layer is formed over the insulating layer. Next, the element layer is separated from the supporting base material and then transferred to the base material. At this time, a material is selected that would cause separation at an interface between the supporting base material and the separation layer, at an interface between the separation layer and the insulating layer, or in the separation layer.

For example, it is preferable that a stacked layer of a layer including a high-melting-point metal material, such as tungsten, and a layer including an oxide of the metal material be used as the separation layer, and a stacked layer of a plurality of layers, such as a silicon nitride layer and a silicon oxynitride layer be used over the separation layer. The use of the high-melting-point metal material is preferable because the degree of freedom of the process for forming the element layer can be increased.

The separation may be performed by application of mechanical power, by etching of the separation layer, by dripping of a liquid into part of the separation interface to penetrate the entire separation interface, or the like. Alternatively, separation may be performed by heating the separation interface by utilizing a difference in thermal expansion coefficient.

The separation layer is not necessarily provided in the case where separation can occur at an interface between the supporting base material and the insulating layer. For example, glass is used as the supporting base material and an organic resin such as polyimide is used as the insulating layer, a separation trigger is formed by locally heating part of the organic resin by laser light or the like, and separation is performed at an interface between the glass and the insulating layer.

Alternatively, a metal layer may be provided between the supporting base material and the insulating layer formed of an organic resin, and separation may be performed at the interface between the metal layer and the insulating layer by heating the metal layer by feeding a current to the metal layer. In that case, the insulating layer formed of an organic resin can be used as a base material.

Examples of such a base material having flexibility include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, it is preferable to use a material with a low thermal expansion coefficient, and for example, a polyamide imide resin, a polyimide resin, PET, or the like with a thermal expansion coefficient lower than or equal to $30 \times 10^{-6}$/K can be suitably used. A substrate in which a fibrous body is impregnated with a resin (also referred to as prepreg) or a substrate whose thermal expansion coefficient is reduced by mixing an inorganic filler with an organic resin can also be used.

In the case where a fibrous body is included in the above material, a high-strength fiber of an organic compound or an inorganic compound is used as the fibrous body. The high-strength fiber is specifically a fiber with a high tensile elastic modulus or a fiber with a high Young's modulus. Typical examples thereof include a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber. As the glass fiber, glass fiber using E glass, S glass, D glass, Q glass, or the like can be used. These fibers may be used in a state of a woven fabric or a nonwoven fabric, and a structure body in which this fibrous body is impregnated with a resin and the resin is cured may be used as the flexible substrate. The structure body including the fibrous body and the resin is preferably used as the flexible substrate, in which case the reliability against bending or breaking due to local pressure can be increased.

Alternatively, glass, metal, or the like that is thin enough to have flexibility can be used as the base material. Alternatively, a composite material where glass and a resin material are attached to each other may be used.

In the structure shown in FIG. 12A, for example, a first separation layer and the insulating layer 262 are formed in this order over a first supporting base material, and then components in a layer over the first separation layer and the insulating layer 262 are formed. Separately, a second separation layer and the insulating layer 212 are formed in this order over a second supporting base material, and then upper components are formed. Next, the first supporting base material and the second supporting base material are bonded to each other using the adhesive layer 220. After that, separation at an interface between the second separation layer and the insulating layer 212 is conducted so that the second supporting base material and the second separation layer are removed, and then the substrate 31 is bonded to the insulating layer 212 using the adhesive layer 211. Further, separation at an interface between the first separation layer and the insulating layer 262 is conducted so that the first supporting base material and the first separation layer are removed, and then the substrate 21 is bonded to the insulating layer 262 using the adhesive layer 261. Note that either side may be subjected to separation and attachment first.

The above is the description of a manufacturing method of a flexible touch panel.

Cross-Sectional Structure Example 2

FIG. 15 is a cross-sectional structure example whose structure is partly different from that of FIG. 12A. Note that descriptions of the portions already described are omitted and different portions are described below.

In the example shown in FIG. 15, the conductive layer 25 is not provided. The conductive layer 24 is provided to cover part of the insulating layer 28. The conductive layer 23 and the conductive layer 24 overlap with each other in a region, and the capacitor 11 is formed in the region.

FIG. 15 also shows a cross-sectional structure of a connection portion 272 in which the conductive layer 24 is electrically connected to a wiring formed by processing the conductive film used for forming the conductive layer 23 through an opening formed in the insulating layer 28.

In the example shown in FIG. 15, the EL layer 222 is separately formed in each pixel. The EL layer 222 can include a light-emitting layer containing a light-emitting material emitting light of one color. In the light-emitting element 204 shown in FIG. 15, the optical adjustment layer 224 shown in FIG. 12B is not included. Furthermore, the coloring layer 52 is not provided in FIG. 15. In this manner, the structure of the light-emitting element can be simplified in the case where the EL layer 222 of the light-emitting element 204 is separately formed in each pixel to obtain light emission with high color purity from the light-emitting element 204.

Here, the distance between one of the conductive layer 23 and the conductive layer 24 which is positioned closer to the display panel than the other and a conductive layer which is the closest to the one of the conductive layers 23 and 24 of the conductive layers provided closer to the display panel than the one of the conductive layers 23 and 24 is preferably greater than or equal to 25 nm and less than or equal to 100 μm, more preferably greater than or equal to 50 nm and less than or equal to 10 μm, still more preferably greater than or equal to 50 nm and less than or equal to 5 μm.

In the example shown in FIG. 15, the second electrode 223 of the light-emitting element 204 corresponds to the conductive layer which is the closest to the conductive layer 24 of the conductive layers provided closer to the display panel than the conductive layer 24. Here, as the distance D between the conductive layer 24 and the second electrode 223 is shorter, a distance between the pair of substrates can be reduced more, and the thickness of the touch panel can be reduced more. In particular, when a flexible substrate is used as the pair of substrates, the touch panel can be flexible and strong against bending.

The above is the description of the cross-sectional structure example 2.

Though this embodiment shows the structure including two substrates, i.e., the substrate supporting the touch sensor and the substrate supporting the display element, the structure is not limited thereto. For example, a structure with three substrates where a display element is sandwiched between two substrates and the substrate supporting a touch sensor is bonded thereto can be employed. Alternatively, a structure with four substrates where a display element sandwiched between two substrates and a touch sensor sandwiched between two substrates are bonded to each other can be employed.

This embodiment can be combined with any of the other embodiments disclosed in this specification as appropriate.

Embodiment 2

In this embodiment, an example of a method for operating the touch panel of one embodiment of the present invention is described with reference to drawings.

Example of Sensing Method of Sensor

Figure 16A:
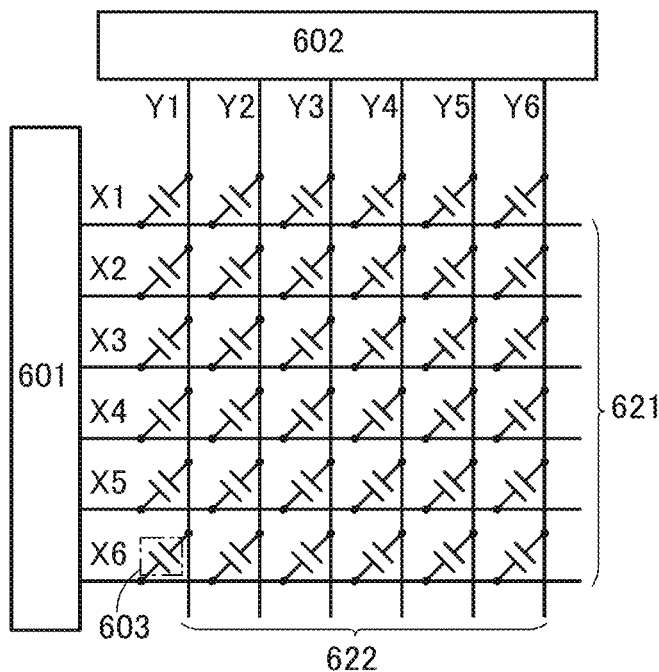
FIGS. 16A and 16B are a block diagram and a timing chart of a touch sensor of an embodiment.

FIG. 16A is a block diagram illustrating the structure of a mutual capacitive touch sensor. FIG. 16A illustrates a pulse voltage output circuit 601 and a current sensing circuit 602. Note that in FIG. 16A, six wirings X1 to X6 represent the electrodes 621 to which a pulse voltage is applied, and six wirings Y1 to Y6 represent the electrodes 622 that detect changes in current. FIG. 16A also illustrates a capacitor 603 that is formed where the electrodes 621 and 622 overlap with each other. Note that functional replacement between the electrodes 621 and 622 is possible.

The pulse voltage output circuit 601 is a circuit for sequentially applying a pulse voltage to the wirings X1 to X6. By application of a pulse voltage to the wirings X1 to X6, an electric field is generated between the electrodes 621 and 622 of the capacitor 603. When the electric field between the electrodes is shielded, for example, a change occurs in the capacitor 603 (mutual capacitance). The approach or contact of a sensing target can be sensed by utilizing this change.

The current sensing circuit 602 is a circuit for detecting changes in current flowing through the wirings Y1 to Y6 that are caused by the change in mutual capacitance in the capacitor 603. No change in current value is detected in the wirings Y1 to Y6 when there is no approach or contact of a sensing target, whereas a decrease in current value is detected when mutual capacitance is decreased owing to the approach or contact of a sensing target. Note that an integrator circuit or the like is used for sensing of current values.

Figure 16B:
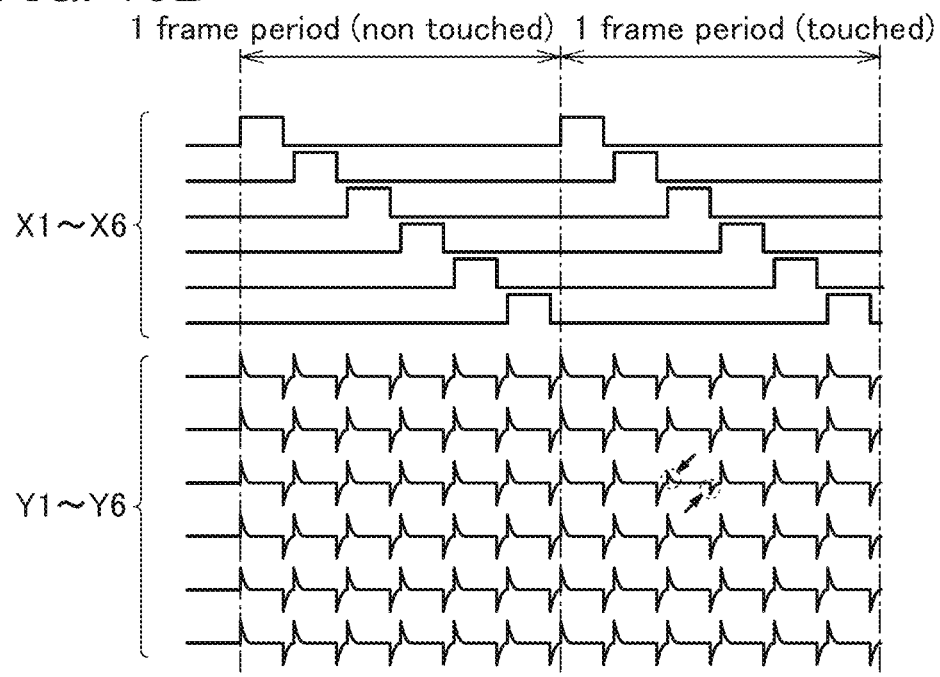

FIG. 16B is a timing chart showing input and output waveforms in the mutual capacitive touch sensor illustrated in FIG. 16A. In FIG. 16B, sensing of a sensing target is performed in all the rows and columns in one frame period. FIG. 16B shows a period when a sensing target is not sensed (not touched) and a period when a sensing target is sensed (touched). Sensed current values of the wirings Y1 to Y6 are shown as the waveforms of voltage values.

A pulse voltage is sequentially applied to the wirings X1 to X6, and the waveforms of the wirings Y1 to Y6 change in accordance with the pulse voltage. When there is no approach or contact of a sensing target, the waveforms of the wirings Y1 to Y6 change in accordance with changes in the voltages of the wirings X1 to X6. The current value is decreased at the point of approach or contact of a sensing target and accordingly the waveform of the voltage value changes.

By detecting a change in mutual capacitance in this manner, the approach or contact of a sensing target can be sensed.

It is preferable that the pulse voltage output circuit 601 and the current sensing circuit 602 be mounted on a substrate in a housing of an electronic appliance or on the touch panel in the form of an IC. In the case where the touch panel has flexibility, parasitic capacitance might be increased in a bent portion of the touch panel, and the influence of noise might be increased. In view of this, it is preferable to use an IC to which a driving method less influenced by noise is applied. For example, it is preferable to use an IC to which a driving method capable of increasing a signal-noise ratio (S/N ratio) is applied.

Figure 17:
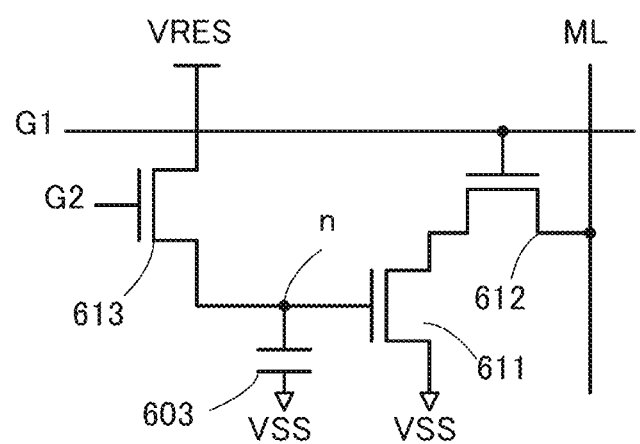
FIG. 17 is a circuit diagram of a touch sensor of an embodiment.

Although FIG. 16A is a passive matrix type touch sensor in which only the capacitor 603 is provided at the intersection of wirings as a touch sensor, an active matrix type touch sensor including a transistor and a capacitor may be used. FIG. 17 is a sensor circuit included in an active matrix type touch sensor.

The sensor circuit includes the capacitor 603 and transistors 611, 612, and 613. A signal G2 is input to a gate of the transistor 613. A voltage VRES is applied to one of a source and a drain of the transistor 613, and one electrode of the capacitor 603 and a gate of the transistor 611 are electrically connected to the other of the source and the drain of the transistor 613. One of a source and a drain of the transistor 611 is electrically connected to one of a source and a drain of the transistor 612, and a voltage VSS is applied to the other of the source and the drain of the transistor 611. A signal G1 is input to a gate of the transistor 612, and a wiring ML is electrically connected to the other of the source and the drain of the transistor 612. The voltage VSS is applied to the other electrode of the capacitor 603.

Next, the operation of the sensor circuit will be described. First, a potential for turning on the transistor 613 is supplied as the signal G2, and a potential with respect to the voltage VRES is thus applied to the node n connected to the gate of the transistor 611. Then, a potential for turning off the transistor 613 is applied as the signal G2, whereby the potential of the node n is maintained.

Then, mutual capacitance of the capacitor 603 changes owing to the approach or contact of a sensing target such as a finger, and accordingly the potential of the node n is changed from VRES.

In reading operation, a potential for turning on the transistor 612 is supplied as the signal G1. A current flowing through the transistor 611, that is, a current flowing through the wiring ML is changed in accordance with the potential of the node n. By sensing this current, the approach or contact of a sensing target can be sensed.

It is preferred that the transistors 611, 612, and 613 each include an oxide semiconductor in a semiconductor layer where a channel is formed. In particular, by using an oxide semiconductor in a semiconductor layer where a channel of the transistor 613 is formed, the potential of the node n can be held for a long time and the frequency of operation (refresh operation) of resupplying VRES to the node n can be reduced.

At least part of this embodiment can be implemented in combination with any of the embodiments described in this specification as appropriate.

Embodiment 3

In this embodiment, electronic appliances and lighting devices that can be fabricated according to one embodiment of the present invention will be described with reference to FIGS. 18A to 18G and FIGS. 19A to 19I.

The touch panel of one embodiment of the present invention has flexibility. Therefore, a touch panel of one embodiment of the present invention can be used in electronic appliances and lighting devices having flexibility. Furthermore, according to one embodiment of the present invention, electronic appliances and lighting devices having high reliability and resistance against repeated bending can be manufactured.

Examples of electronic appliances include a television set (also referred to as a television or a television receiver), a monitor of a computer or the like, a digital camera, a digital video camera, a digital photo frame, a mobile phone (also referred to as a mobile phone device), a portable game machine, a portable information terminal, an audio reproducing device, a large game machine such as a pinball machine, and the like.

The touch panel of one embodiment of the present invention has flexibility and therefore can be incorporated along a curved inside/outside wall surface of a house or a building or a curved interior/exterior surface of a car.

An electronic appliance of one embodiment of the present invention may include a touch panel and a secondary battery. It is preferable that the secondary battery is capable of being charged by contactless power transmission.

As examples of the secondary battery, a lithium ion secondary battery such as a lithium polymer battery (lithium ion polymer battery) using a gel electrolyte, a lithium ion battery, a nickel-hydride battery, a nickel-cadmium battery, an organic radical battery, a lead-acid battery, an air secondary battery, a nickel-zinc battery, and a silver-zinc battery can be given.

The electronic appliance of one embodiment of the present invention may include a touch panel and an antenna. When a signal is received by the antenna, the electronic appliance can display an image, data, or the like on a display portion. When the electronic appliance includes a secondary battery, the antenna may be used for contactless power transmission.

Figure 18A:
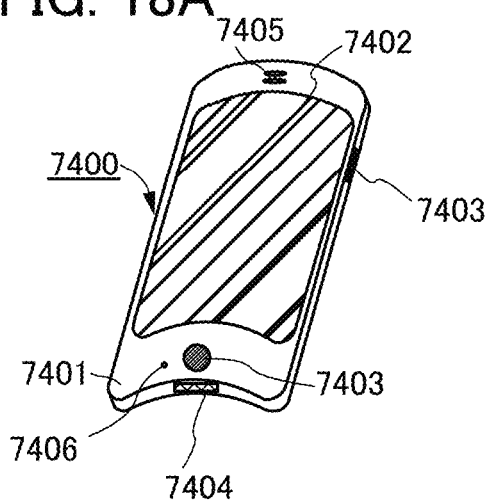
FIGS. 18A to 18G each illustrate an electronic appliance of an embodiment.

FIG. 18A illustrates an example of a mobile phone. The mobile phone 7400 is provided with a display portion 7402 incorporated in a housing 7401, operation buttons 7403, an external connection port 7404, a speaker 7405, a microphone 7406, and the like. Note that the mobile phone 7400 is manufactured by using the touch panel of one embodiment of the present invention for the display portion 7402. In accordance with one embodiment of the present invention, a highly reliable mobile phone having a curved display portion can be provided at a high yield.

When the display portion 7402 of the mobile phone 7400 illustrated in FIG. 18A is touched with a finger or the like, data can be input into the mobile phone 7400. Further, operations such as making a call and inputting a letter can be performed by touch on the display portion 7402 with a finger or the like.

With the operation buttons 7403, power ON or OFF can be switched. In addition, types of images displayed on the display portion 7402 can be switched; switching images from a mail creation screen to a main menu screen.

Figure 18B:
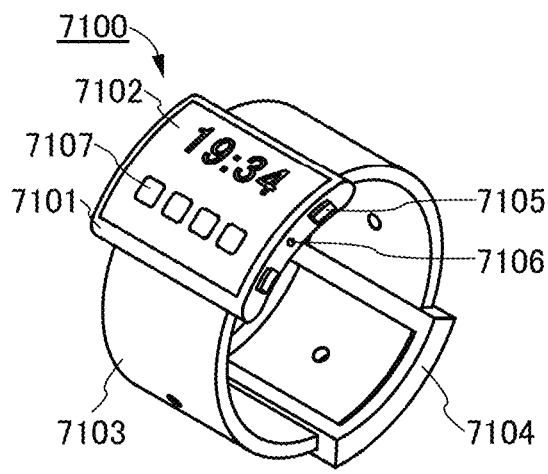

FIG. 18B illustrates an example of a wrist-watch-type portable information terminal. A portable information terminal 7100 includes a housing 7101, a display portion 7102, a band 7103, a buckle 7104, an operation button 7105, an input/output terminal 7106, and the like.

The portable information terminal 7100 is capable of executing a variety of applications such as mobile phone calls, e-mailing, reading and editing texts, music reproduction, Internet communication, and a computer game.

The display surface of the display portion 7102 is bent, and images can be displayed on the bent display surface. Furthermore, the display portion 7102 includes a touch sensor, and operation can be performed by touching the screen with a finger, a stylus, or the like. For example, by touching an icon 7107 displayed on the display portion 7102, an application can be started.

With the operation button 7105, a variety of functions such as time setting, power ON/OFF, ON/OFF of wireless communication, setting and cancellation of manner mode, and setting and cancellation of power saving mode can be performed. For example, the functions of the operation button 7105 can be set freely by setting the operating system incorporated in the portable information terminal 7100.

The portable information terminal 7100 can employ near field communication that is a communication method based on an existing communication standard. In that case, for example, mutual communication between the portable information terminal 7100 and a headset capable of wireless communication can be performed, and thus hands-free calling is possible.

Moreover, the portable information terminal 7100 includes the input/output terminal 7106, and data can be directly transmitted to and received from another information terminal via a connector. Charging through the input/output terminal 7106 is possible. Note that the charging operation may be performed by wireless power feeding without using the input/output terminal 7106.

The display portion 7102 of the portable information terminal 7100 includes the touch panel of one embodiment of the present invention. According to one embodiment of the present invention, a highly reliable portable information terminal having a curved display portion can be provided with a high yield.

Figure 18C:
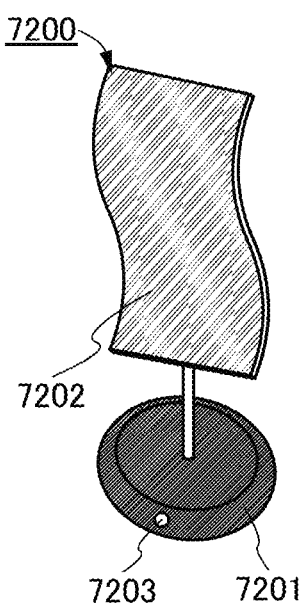
Figure 18D:
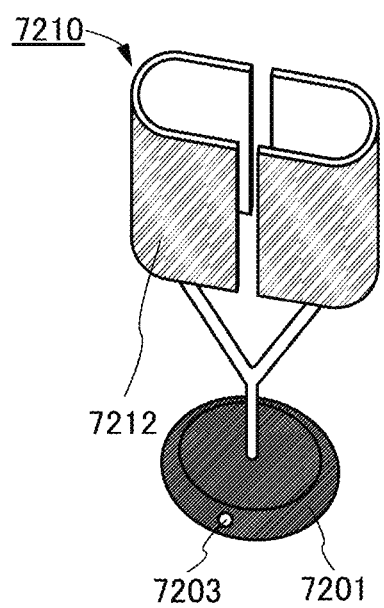
Figure 18E:
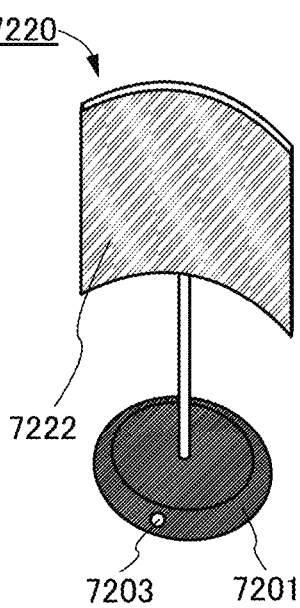

FIGS. 18C to 18E illustrate examples of a lighting device. Lighting devices 7200, 7210, and 7220 each include a stage 7201 provided with an operation switch 7203 and a light-emitting portion supported by the stage 7201.

The lighting device 7200 illustrated in FIG. 18C includes a light-emitting portion 7202 having a wave-shaped light-emitting surface, and thus has good design.

A light-emitting portion 7212 included in the lighting device 7210 illustrated in FIG. 18D has two convex-curved light-emitting portions symmetrically placed. Thus, all directions can be illuminated with the lighting device 7210 as a center.

The lighting device 7220 illustrated in FIG. 18E includes a concave-curved light-emitting portion 7222. This is suitable for illuminating a specific range because light emitted from the concave-curved light-emitting portion 7222 is collected to the front of the lighting device 7220.

The light-emitting portion included in each of the lighting devices 7200, 7210, and 7220 is flexible; thus, the light-emitting portion may be fixed on a plastic member, a movable frame, or the like so that an emission surface of the light-emitting portion can be bent freely depending on the intended use.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface is curved to have a depressed shape, whereby a particular region can be brightly illuminated, or the light-emitting surface is curved to have a projecting shape, whereby a whole room can be brightly illuminated.

Here, the light-emitting portions each include the touch panel of one embodiment of the present invention. In accordance with one embodiment of the present invention, a highly reliable lighting device having a curved light-emitting portion can be provided at a high yield.

Figure 18F:
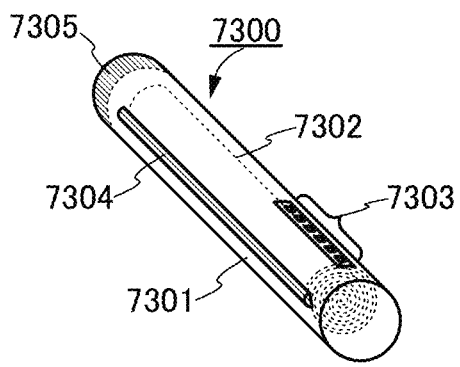

FIG. 18F illustrates an example of a portable touch panel. A touch panel 7300 includes a housing 7301, a display portion 7302, operation buttons 7303, a display portion pull 7304, and a control portion 7305.

The touch panel 7300 includes a rolled flexible display portion 7302 in the cylindrical housing 7301.

The touch panel 7300 can receive a video signal with the control portion 7305 and can display the received video on the display portion 7302. In addition, a battery is included in the control portion 7305. Moreover, a terminal portion for connecting a connector may be included in the control portion 7305 so that a video signal or power can be directly supplied from the outside with a wiring.

By pressing the operation buttons 7303, power ON/OFF, switching of displayed videos, and the like can be performed.

Figure 18G:
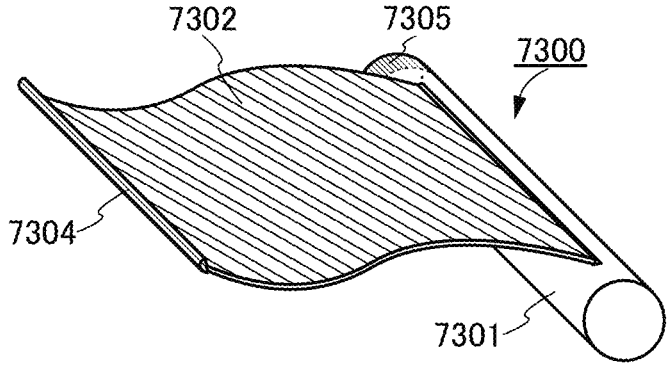

FIG. 18G illustrates the touch panel 7300 in a state where the display portion 7302 is pulled out with the display portion pull 7304. Videos can be displayed on the display portion 7302 in this state. Further, the operation buttons 7303 on the surface of the housing 7301 allow one-handed operation. The operation buttons 7303 are provided not in the center of the housing 7301 but on one side of the housing 7301 as illustrated in FIG. 18F, which makes one-handed operation easy.

Note that a reinforcement frame may be provided for a side portion of the display portion 7302 so that the display portion 7302 has a flat display surface when pulled out.

Note that in addition to this structure, a speaker may be provided for the housing so that sound is output with an audio signal received together with a video signal.

The display portion 7302 includes the touch panel of one embodiment of the present invention. According to one embodiment of the present invention, a lightweight and highly reliable touch panel can be provided with a high yield.

Figure 19A:
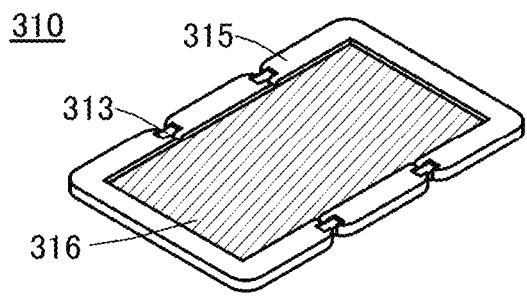
FIGS. 19A to 19I illustrate electronic appliances of an embodiment.
Figure 19B:
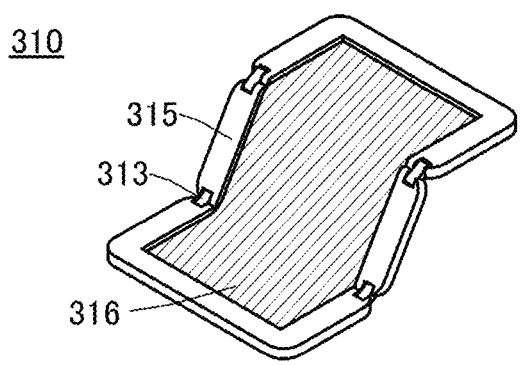
Figure 19C:
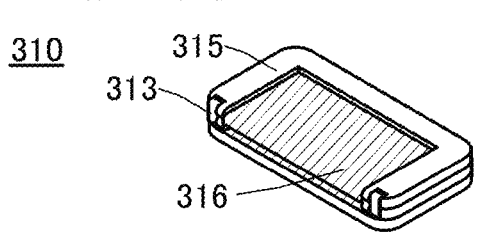

FIGS. 19A to 19C illustrate a foldable portable information terminal 310. FIG. 19A illustrates the portable information terminal 310 that is opened. FIG. 19B illustrates the portable information terminal 310 that is being opened or being folded. FIG. 19C illustrates the portable information terminal 310 that is folded. The portable information terminal 310 is highly portable when folded. When the portable information terminal 310 is opened, a seamless large display region is highly browsable.

A display panel 316 is supported by three housings 315 joined together by hinges 313. By folding the portable information terminal 310 at a connection portion between two housings 315 with the hinges 313, the portable information terminal 310 can be reversibly changed in shape from an opened state to a folded state. The touch panel according to one embodiment of the present invention can be used for the display panel 316. For example, a touch panel that can be bent with a radius of curvature of greater than or equal to 1 mm and less than or equal to 150 mm can be used.

Note that in one embodiment of the present invention, a sensor that senses whether the touch panel is in a folded state or an unfolded state and supplies sensing data may be used. The operation of a folded portion (or a portion that becomes invisible by a user by folding) of the touch panel may be stopped by a control device through the acquisition of data indicating the folded state of the touch panel. Specifically, display of the portion may be stopped, and furthermore, sensing by the touch sensor may be stopped.

Similarly, the control device of the touch panel may acquire data indicating the unfolded state of the touch panel to resume displaying and sensing by the touch sensor.

Figure 19D:
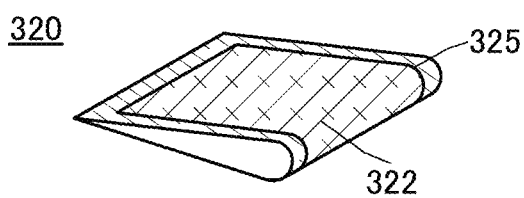
Figure 19E:
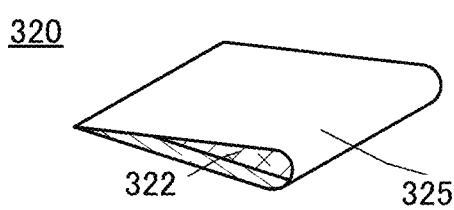

FIGS. 19D and 19E each illustrate a foldable portable information terminal 320. FIG. 19D illustrates the portable information terminal 320 that is folded so that a display portion 322 is on the outside. FIG. 19E illustrates the portable information terminal 320 that is folded so that the display portion 322 is on the inside. When the portable information terminal 320 is not used, the portable information terminal 320 is folded so that a non-display portion 325 faces the outside, whereby the display portion 322 can be prevented from being contaminated or damaged. The touch panel in one embodiment of the present invention can be used for the display portion 322.

Figure 19F:
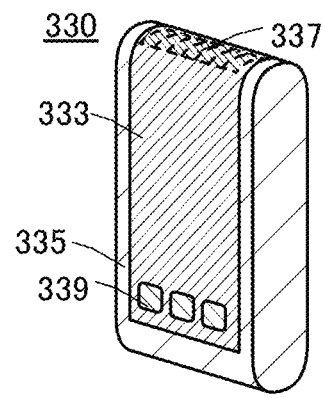
Figure 19G:
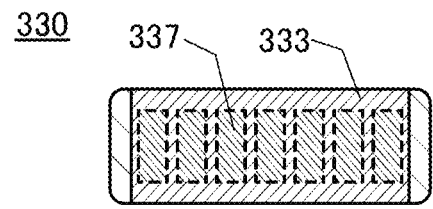
Figure 19H:
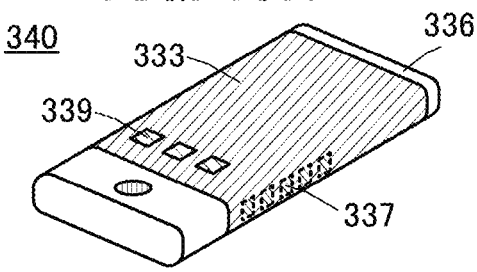

FIG. 19F is a perspective view illustrating an external shape of a portable information terminal 330. FIG. 19G is a top view of the portable information terminal 330. FIG. 19H is a perspective view illustrating an external shape of a portable information terminal 340.

The portable information terminals 330 and 340 each function as, for example, one or more of a telephone set, a notebook, and an information browsing system. Specifically, the portable information terminals 330 and 340 each can be used as a smartphone.

The portable information terminals 330 and 340 can display characters and image information on its plurality of surfaces. For example, three operation buttons 339 can be displayed on one surface (FIGS. 19F and 19H). In addition, information 337 indicated by dashed rectangles can be displayed on another surface (FIGS. 19F, 19G, and 19H). Examples of the information 337 include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation buttons 339, an icon, or the like may be displayed in place of the information 337. Although FIGS. 19F and 19G illustrate an example in which the information 337 is displayed at the top, one embodiment of the present invention is not limited thereto. The information may be displayed, for example, on the side as in the portable information terminal 340 illustrated in FIG. 19H.

For example, a user of the portable information terminal 330 can see the display (here, the information 337) with the portable information terminal 330 put in a breast pocket of his/her clothes.

Specifically, a caller's phone number, name, or the like of an incoming call is displayed in a position that can be seen from above the portable information terminal 330. Thus, the user can see the display without taking out the portable information terminal 330 from the pocket and decide whether to answer the call.

A touch panel of one embodiment of the present invention can be used for a display portion 333 mounted in each of a housing 335 of the portable information terminal 330 and a housing 336 of the portable information terminal 340. According to one embodiment of the present invention, a highly reliable touch panel having a curved display portion can be provided with a high yield.

Figure 19I:
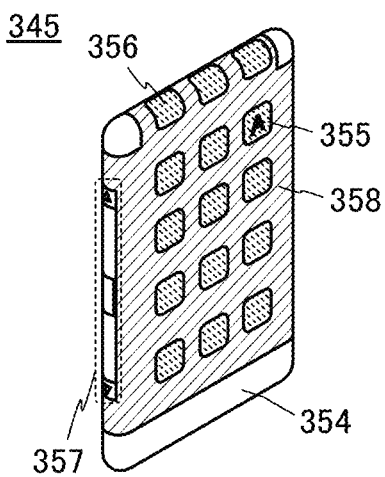

As in a portable information terminal 345 illustrated in FIG. 19I, data may be displayed on three or more surfaces. Here, data 355, data 356, and data 357 are displayed on different surfaces.

The touch panel of one embodiment of the present invention can be used for a display portion 358 included in a housing 354 of the portable information terminal 345. According to one embodiment of the present invention, a highly reliable touch panel having a curved display portion can be provided with a high yield.

At least part of this embodiment can be implemented in combination with any of the embodiments described in this specification as appropriate.

Example

In this example, a foldable touch panel of one embodiment of the present invention was fabricated. This example also describes the results of performing evaluation of a time constant and performing a folding test on the touch panel.

Fabrication of Touch Panel

In this example, an in-cell touch panel in which a touch sensor was formed in a counter substrate (a substrate on the display surface side) of a flexible display panel was fabricated. An electrode of the touch sensor had a metal-mesh structure to reduce the load capacitance formed between the touch sensor and the display panel. Thus, the whole touch panel can be thin enough to be freely folded by a user. In addition, because of the small load capacitance, the influence of noise from the display panel to the touch sensor can be suppressed, so that defects such as false detection and detection failure can be suppressed.

As a method for driving the in-cell touch panel fabricated in this example, a projected mutual capacitive type was employed.

The touch panel having the cross-sectional structure shown in FIGS. 12A and 12B was fabricated in this example. As the mesh pattern of the touch sensor, the pattern shown in FIG. 6 was used.

Figure 20:
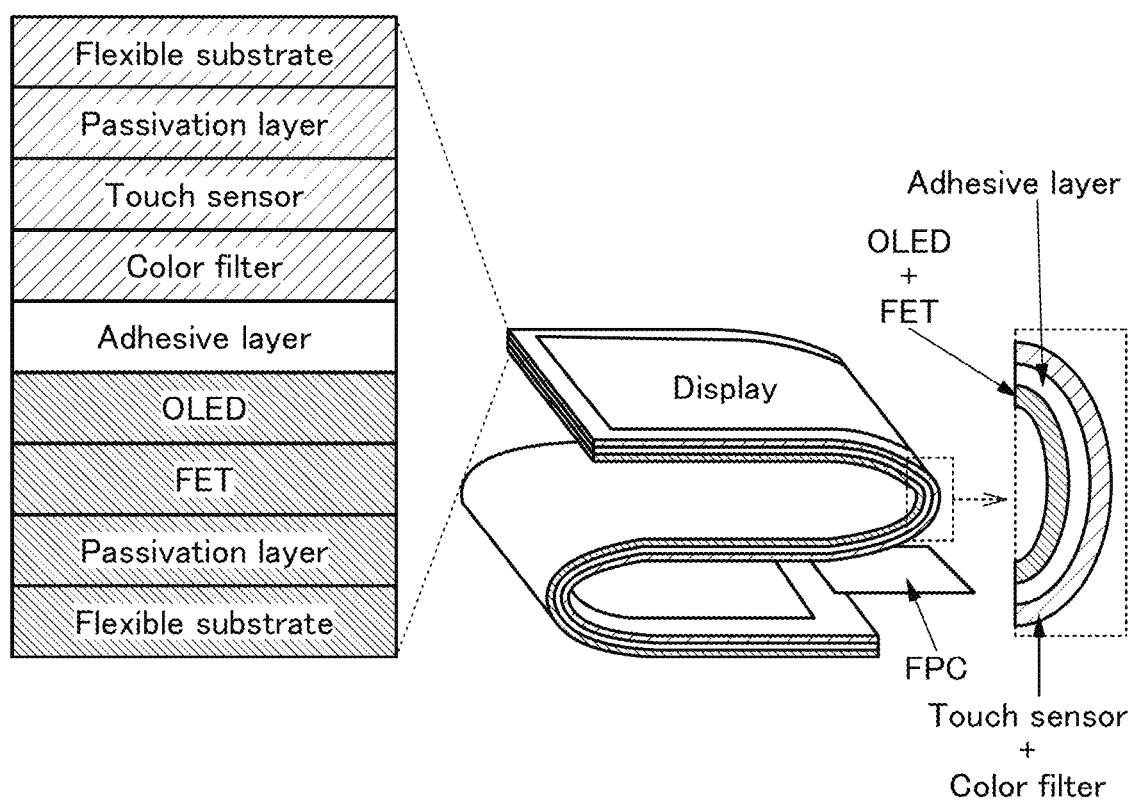
FIG. 20 shows a structure of a touch panel of an example.

FIG. 20 shows a structure of the touch panel fabricated in this example. A schematic view of the touch panel is shown in the center of FIG. 20, a cross-sectional structure of the touch panel is shown in the left side thereof, and an enlarged view of a bent portion of the touch panel is shown in the right side thereof. The touch panel includes a display portion (denoted by Display) having flexibility and an FPC. In the structure of the touch panel, two flexible substrates were bonded to each other with an adhesive layer, and a passivation layer was provided on each of the facing surfaces of the flexible substrates. An FET layer (denoted by FET) and an organic EL element (denoted by OLED) were formed over the passivation layer over one of the flexible substrates. A touch sensor and a color filter were formed over the passivation layer over the other of the flexible substrates. As shown in FIG. 20, the touch panel fabricated in this example can be folded so that its display surface has a convex curve and a concave curve.

First, a separation layer, the passivation layer, the FET layer, and the organic EL element were formed over a glass substrate.

As a transistor (e.g., the transistor 201) included in the FET layer, a transistor including an oxide semiconductor as a semiconductor where a channel is formed was used. Here, a crystalline oxide semiconductor having c-axis alignment in a direction perpendicular to a film surface (CAAC-OS: c-axis aligned crystalline-oxide semiconductor) was used as the oxide semiconductor in this example.

A CAAC-OS is a crystalline oxide semiconductor having c-axis alignment of crystals in a direction substantially perpendicular to the film surface. It has been found that oxide semiconductors have a variety of crystal structures other than a single-crystal structure. An example of such structures is a nano-crystal (nc) structure, which is an aggregate of nanoscale microcrystals. The crystallinity of a CAAC-OS structure is lower than that of a single-crystal structure and higher than that of an nc structure. Moreover, since the CAAC-OS does not have a grain boundary, a stable and uniform film can be formed over a large area, and stress that is caused by bending a flexible light-emitting device does not easily make a crack in a CAAC-OS film.

In—Ga—Zn-based oxide was used as the oxide semiconductor material in this example.

As a pixel electrode (the first electrode 221), alloy containing silver with extremely high reflectivity was used. A transparent electrode layer (the optical adjustment layer 224) was formed over the pixel electrode and the thickness thereof varied as appropriate depending on the structure of the sub-pixel to produce a microcavity effect.

As the organic EL element, a top-emission white EL element was used. The organic EL element had a tandem structure in which a blue light-emitting unit and a yellow light-emitting unit were stacked.

Furthermore, a separation layer, the passivation layer, a light-blocking layer, a touch sensor electrode, and the color filter were formed over another glass substrate. In order to suppress reflection of light by the touch sensor electrode, the light-blocking layer was provided between the touch sensor electrode and the passivation layer.

Then, the two substrates were bonded to each other with the adhesive layer. The distance (cell gap) between the substrates was set to approximately 5 μm. Then, separation of each substrate was made to occur between the separation layer and the passivation layer, and the flexible substrates were attached. The flexible substrates were plastic substrates each having a thickness of approximately 20 μm.

In this manner, the touch panel was fabricated. Table 1 shows the specifications of a display device, and Table 2 shows the specifications of the touch sensor.

TABLE 1

| Specifications of 8.67 inch OLED Display | |
|---|---|
| Screen diagonal | 8.67 inch |
| Driving method | Active Matrix |
| Number of effective pixels | 1080 × RGBY × 1920 |
| Pixel pitch | 0.100 mm × 0.100 mm |
| Pixel density | 254 ppi |
| Aperture ratio | 0.46% |
| Pixel arrangement | RGBY checker |
| Pixel circuit | 6Tr + 1 C/cell |
| Source driver | COF |
| Scan driver | Integrated |

TABLE 2

| Specifications of 8.67 inch Touch Sensor | |
|---|---|
| Screen diagonal | 8.67 inch |
| Driving method | Projection capacitance (Mutual capacitance) |
| Sensor structure | Metal mesh |
| Number of sensor units | 48(T) × 27(R) |
| Sensor unit pitch | 4.00 mm × 4.00 mm |

The pixel included in the touch panel fabricated in this example included four RGBY sub-pixels. The use of the Y (yellow) sub-pixel increased current efficiency and reduced chromaticity variation depending on the viewing angle more than the case of using a white sub-pixel.

For the touch sensor, 48 transmitting electrodes were arranged in the longitudinal direction of the display portion and 27 receiving electrodes were arranged in the lateral direction thereof with 4 mm pitches. A matrix of 40×40 pixels in the display portion corresponds to one unit of the touch sensor.

Touch Panel

Figure 21A:
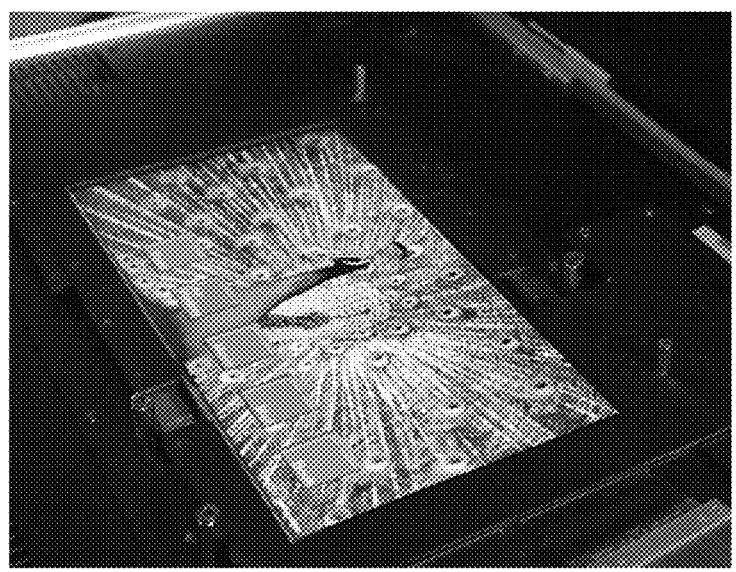
FIGS. 21A to 21C are photographs of a touch panel of an example.
Figure 21B:
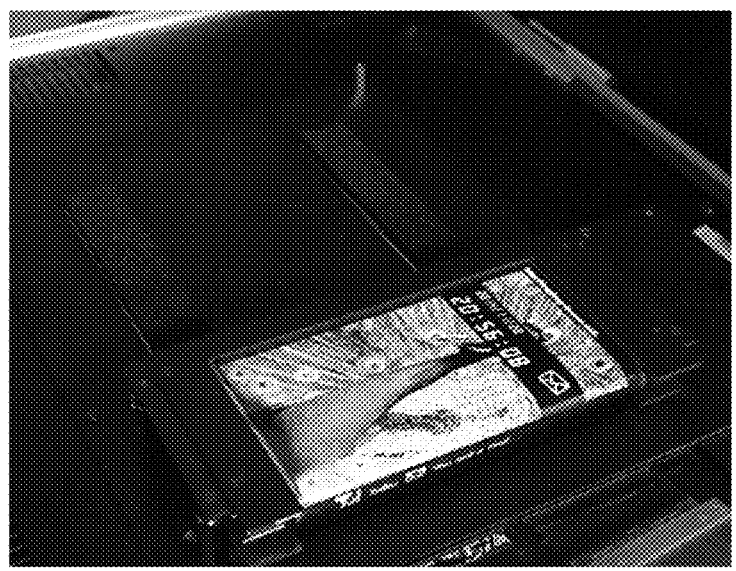
Figure 21C:

FIGS. 21A to 21C are photographs of the fabricated touch panel. FIG. 21A shows a state where the display panel is unfolded. FIG. 21B shows a state where the display panel is folded in three. FIG. 21C shows a state where the display panel is touched while folded. It was demonstrated that a touch on each of a flat surface portion, a convex curved portion, and a concave curved portion of the surface of the touch panel was detected appropriately.

Since the pixels are arranged in the openings in the mesh of the touch sensor electrode, providing the touch sensor does not significantly affect the light extraction efficiency.

Evaluation of Time Constant

Next, the parasitic capacitance and resistance between the receiving electrode of the fabricated touch panel and the display panel were measured with varying frequency. An LCR meter (4275A manufactured by Agilent Technologies, Inc.) was used for the measurement.

Figure 22:
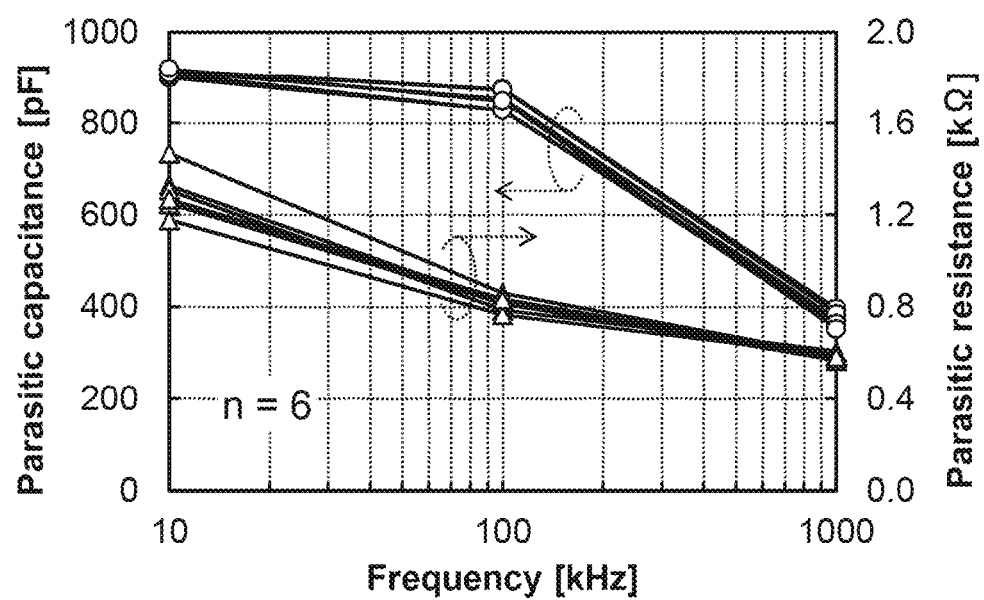
FIG. 22 shows measurement results of parasitic capacitance and parasitic resistance of a touch panel of an example.

FIG. 22 shows the measurement results. The vertical axis on the left side, the vertical axis on the right side, and the horizontal axis in FIG. 22 represent parasitic capacitance, parasitic resistance, and frequency, respectively. The number of measurements was six. As shown in FIG. 22, with 10 kHz measurement frequency, the parasitic capacitance was approximately 910 pF, and the parasitic resistance was approximately 1.3 kΩ. The time constant was calculated to be approximately 1.2 μs. This value is small but not so small as to cause failure of touch detection.

Folding Test

Next, the results of performing a folding test on the fabricated touch panel are described. In the folding test, an operation of folding and unfolding the touch panel with a curvature radius of 5 mm or 3 mm was performed once every two seconds, and the operation was repeated 100,000 times. The folding and unfolding operation was performed under two different conditions: inward folding (the display surface faces inward) and outward folding (the display surface faces outward). Even after the folding and unfolding operation was performed 100,000 times, normal display and touch detection were achieved.

These results show that the touch panel of one embodiment of the present invention is a foldable touch panel with high reliability, high visibility, and low power consumption. This touch panel will lead to a novel mobile device.

This application is based on Japanese Patent Application serial no. 2014-112316 filed with Japan Patent Office on May 30, 2014, Japanese Patent Application serial no. 2014-128409 filed with Japan Patent Office on Jun. 23, 2014, and Japanese Patent Application serial no. 2014-242912 filed with Japan Patent Office on Dec. 1, 2014, the entire contents of which are hereby incorporated by reference.

What is claimed is:

1. A touch panel comprising:
   a first conductive layer;
   a second conductive layer;
   a third conductive layer;
   a fourth conductive layer;
   a fifth conductive layer; and
   an insulating layer,
   wherein the first conductive layer, the second conductive layer, the third conductive layer, and the fourth conductive layer are provided over a same plane,
   wherein the fourth conductive layer is electrically insulated from the first conductive layer, the second conductive layer, and the third conductive layer,
   wherein the fifth conductive layer is electrically connected to the second conductive layer and the third conductive layer,
   wherein the first conductive layer extends in a first direction and the fifth conductive layer extends in a second direction that crosses the first direction,
   wherein the first conductive layer comprises a first region which overlaps with the fifth conductive layer with the insulating layer interposed therebetween and a second region which does not overlap with the fifth conductive layer or the insulating layer, wherein the first region is narrower than the second region, wherein the first conductive layer and the fifth conductive layer form a capacitor, wherein the fourth conductive layer has a cross-like shape, and wherein a width of the cross-like shape of the fourth conductive layer is smaller than a width of the fifth conductive layer.

2. The touch panel according to claim 1, wherein the first conductive layer comprises a first opening, and wherein the second conductive layer comprises a second opening.

3. The touch panel according to claim 1, further comprising a light-blocking layer over and overlapping with the first conductive layer and the second conductive layer.

4. The touch panel according to claim 1, wherein a plurality of cross-like patterns are provided as the fourth conductive layer, and wherein each of the cross-like patterns are provided between the first conductive layer and the second conductive layer or between the first conductive layer and the second conductive layer.

5. A module comprising:

the touch panel according to claim 1; and at least one of a flexible printed circuit and a tape carrier package.

6. An electronic appliance comprising:

the touch panel according to claim 1; and at least one of a battery, an antenna, a housing, an operation button, an external connection port, a speaker, and a microphone.

7. A display device comprising:

a first substrate;

a transistor over the first substrate;

a display element electrically connected to the transistor;

a first conductive layer;

a second conductive layer;

a third conductive layer;

a fourth conductive layer;

a fifth conductive layer; and an insulating layer, wherein the first conductive layer, the second conductive layer, the third conductive layer, and the fourth conductive layer are provided over a same plane, wherein the fourth conductive layer is electrically insulated from the first conductive layer, the second conductive layer, and the third conductive layer, wherein the fifth conductive layer is electrically connected to the second conductive layer and the third conductive layer, wherein the first conductive layer extends in a first direction and the fifth conductive layer extends in a second direction that crosses the first direction, wherein the first conductive layer comprises a first region which overlaps with the fifth conductive layer with the insulating layer interposed therebetween and a second region which does not overlap with the fifth conductive layer or the insulating layer, wherein the first region is narrower than the second region, wherein the first conductive layer and the fifth conductive layer form a capacitor, wherein the fourth conductive layer has a cross-like shape, and wherein a width of the cross-like shape of the fourth conductive layer is smaller than a width of the fifth conductive layer.

8. The display device according to claim 7, wherein the first conductive layer comprises a first opening, and wherein the second conductive layer comprises a second opening.

9. The display device according to claim 7, further comprising a light-blocking layer over and overlapping with the first conductive layer and the second conductive layer, wherein a second substrate is over the light-blocking layer.

10. The display device according to claim 7, wherein a plurality of cross-like patterns are provided as the fourth conductive layer, and wherein each of the cross-like patterns are provided between the first conductive layer and the second conductive layer or between the first conductive layer and the third conductive layer.

11. A module comprising:

the display device according to claim 7; and at least one of a flexible printed circuit and a tape carrier package.

12. An electronic appliance comprising:

the display device according to claim 7; and at least one of a battery, an antenna, a housing, an operation button, an external connection port, a speaker, and a microphone.

\* \* \* \* \*